(12) United States Patent
Asaji et al.

(10) Patent No.: US 12,125,758 B2
(45) Date of Patent: Oct. 22, 2024

(54) POWER SEMICONDUCTOR DEVICE AND METHOD OF MANUFACTURING THE SAME, AND POWER CONVERSION DEVICE

(71) Applicant: Mitsubishi Electric Corporation, Tokyo (JP)

(72) Inventors: Nobuhiro Asaji, Tokyo (JP); Kazuya Okada, Tokyo (JP); Hidetoshi Ishibashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 389 days.

(21) Appl. No.: 17/771,206

(22) PCT Filed: Nov. 18, 2020

(86) PCT No.: PCT/JP2020/042948
§ 371 (c)(1),
(2) Date: Apr. 22, 2022

(87) PCT Pub. No.: WO2021/100747
PCT Pub. Date: May 27, 2021

(65) Prior Publication Data
US 2022/0415738 A1 Dec. 29, 2022

(30) Foreign Application Priority Data
Nov. 20, 2019 (JP) .................................. 2019-209605

(51) Int. Cl.
*H01L 23/31* (2006.01)
*H01L 23/00* (2006.01)

(52) U.S. Cl.
CPC .......... *H01L 23/3107* (2013.01); *H01L 24/18* (2013.01); *H01L 24/48* (2013.01);
(Continued)

(58) Field of Classification Search
CPC .................................................. H01L 23/3107
(Continued)

(56) References Cited

U.S. PATENT DOCUMENTS 9,991,220 B2 * 6/2018 Nakamura ............. H01L 25/07
2009/0246910 A1 10/2009 Taniguchi et al.
(Continued)

FOREIGN PATENT DOCUMENTS

JP 2009231690 A 10/2009
JP 2014199955 A 10/2014
(Continued)

OTHER PUBLICATIONS

International Search Report (PCT/ISA/210) with translation and Written Opinion (PCT/ISA/237) mailed on Feb. 2, 2021, by the Japan Patent Office as the International Searching Authority for International Application No. PCT/JP2020/042948. (9 pages).

*Primary Examiner* — Ajay Arora
(74) *Attorney, Agent, or Firm* — BUCHANAN, INGERSOLL & ROONEY PC

(57) ABSTRACT

A power semiconductor device in which the size of an insulating substrate is reduced and connection failure can be suppressed includes an insulating substrate, a semiconductor element, and a printed circuit board. The semiconductor element is bonded to one main surface of the insulating substrate. The printed circuit board is bonded to face the semiconductor element. The semiconductor element has a main electrode and a signal electrode. The printed circuit board includes a core member, a first conductor layer, and a second conductor layer. The second conductor layer has a bonding pad. The printed circuit board has a missing portion. A metal column portion is arranged to pass through the inside of the missing portion and reach the insulating substrate. The signal electrode and the bonding pad are
(Continued)

connected by a metal wire. The metal column portion and the insulating substrate are bonded.

13 Claims, 17 Drawing Sheets

(52) U.S. Cl.
CPC .... *H01L 24/73* (2013.01); *H01L 2224/48091* (2013.01); *H01L 2224/73265* (2013.01); *H01L 2924/182* (2013.01)

(58) Field of Classification Search
USPC .......................................................... 257/691
See application file for complete search history.

(56) References Cited

U.S. PATENT DOCUMENTS

2018/0301421 A1\* 10/2018 Yamashita .............. H01L 21/52
2020/0091130 A1\* 3/2020 Taniguchi ............... H01L 28/20

FOREIGN PATENT DOCUMENTS

| JP | 2017199809 A | 11/2017 |
| WO | 2020039986 A1 | 2/2020 |

\* cited by examiner

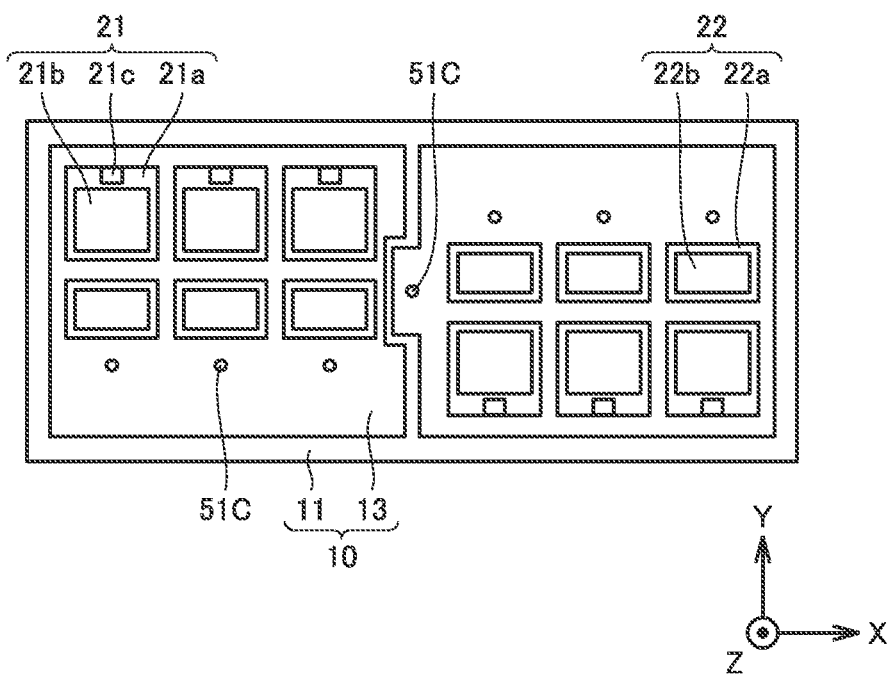
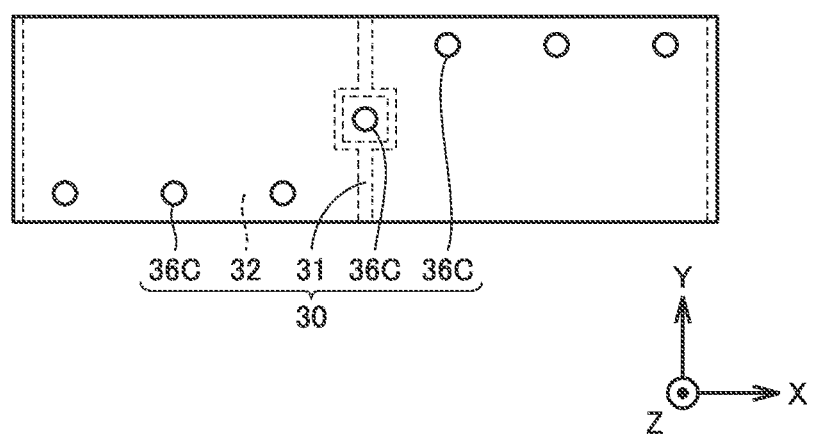

POWER SEMICONDUCTOR DEVICE AND METHOD OF MANUFACTURING THE SAME, AND POWER CONVERSION DEVICE

TECHNICAL FIELD

The present disclosure relates to a power semiconductor device and a method of manufacturing the same.

BACKGROUND ART

Power semiconductor devices are used for control of main power of devices in a wide variety of fields, such as industrial devices, electric railways, and home electrical appliances. Power semiconductor devices installed in industrial devices particularly require downsizing, high heat dissipation, and high reliability. In a power semiconductor device, power semiconductor elements such as IGBTs (Insulated Gate Bipolar Transistors) and FWDs (Free Wheeling Diodes) are mounted on an insulating substrate with high heat dissipation. Wiring is connected to the surface electrodes of the power semiconductor elements mounted on the insulating substrate. A circuit of the power semiconductor device is thus formed.

In this way, wiring is connected on the insulating substrate in the power semiconductor device. The area of the expensive insulating substrate is therefore increased. This increases the cost for power semiconductor devices. When the area of the insulating substrate is large, the outer shape of the power semiconductor device is also large. For example, in Japanese Patent Laying-Open No. 2014-199955 (PTL 1), a semiconductor element bonded on an insulating substrate and a metal foil formed on a printed circuit board arranged to face the insulating substrate are connected by a post electrode formed on the printed circuit board. Presumably, the area of the insulating substrate is reduced because the printed circuit board is arranged to overlap the insulating substrate.

CITATION LIST

Patent Literature

PTL 1: Japanese Patent Laying-Open No. 2014-199955

SUMMARY OF INVENTION

Technical Problem

In Japanese Patent Laying-Open No. 2014-199955, the post electrode is connected immediately above the emitter electrode of the semiconductor element. The emitter electrode has an extremally small area in a two-dimensional view. It is therefore difficult to align the emitter electrode and the post electrode such that the post electrode overlaps immediately above the emitter electrode. Thus, misalignment may occur between the emitter electrode and the post electrode and cause a connection failure between them.

The present disclosure is made in view of the problem above. An object of the present disclosure is to provide a power semiconductor device in which the size of the insulating substrate is reduced and connection failure is suppressed, and a method of manufacturing the same, and a power conversion device including the power conversion device.

Solution to Problem

A power semiconductor device according to the present disclosure includes an insulating substrate, a semiconductor element, and a printed circuit board. The semiconductor element is bonded to one main surface of the insulating substrate. The printed circuit board is bonded to face the semiconductor element. The semiconductor element has a main electrode and a signal electrode. The printed circuit board includes a core member, a first conductor layer formed on a first main surface on the semiconductor element side of the core member, and a second conductor layer formed on a second main surface on an opposite side to the first main surface of the core member. The second conductor layer has a bonding pad. The printed circuit board has a missing portion in which the first conductor layer is partially missing. The power semiconductor device further includes a metal column portion passing through inside of the missing portion, reaching the insulating substrate, and being connected to the printed circuit board by a first conductive member. The signal electrode and the bonding pad are connected by a metal wire. The metal column portion and the insulating substrate are bonded by a second conductive member.

In a method of manufacturing a power semiconductor device according to the present disclosure, an insulating substrate having one main surface on which a semiconductor element having a signal electrode is bonded is prepared. A printed circuit board is prepared which includes a core member, a first conductor layer formed on a first main surface of the core member, and a second conductor layer formed on a second main surface on an opposite side to the first main surface of the core member. The printed circuit board has a missing portion in which the first conductor layer is partially missing. A metal column portion passing through inside of the missing portion and extending to outside of the missing portion is bonded to the missing portion by a first conductive member. The printed circuit board is arranged such that the printed circuit board faces the semiconductor element, and the metal column portion and the insulating substrate are bonded by a second conductive member. The signal electrode is connected to a bonding pad included in the second conductor layer by a metal wire.

Advantageous Effects of Invention

The present disclosure provides a power semiconductor device in which the size of the insulating substrate is reduced and connection failure is suppressed, and a method of manufacturing the same, and a power conversion device including the power conversion device.

BRIEF DESCRIPTION OF DRAWINGS

FIG. 3 is a schematic plan view specifically showing a portion having semiconductor elements in the power semiconductor device in FIG. 1.

FIG. 4 is a schematic plan view specifically showing a manner of a core member and a conductor layer on the lower side in the Z direction of a printed circuit board in the power semiconductor device in FIG. 1.

DESCRIPTION OF EMBODIMENTS

Embodiments will be described below with reference to the drawings.

First Embodiment

Figure 1:
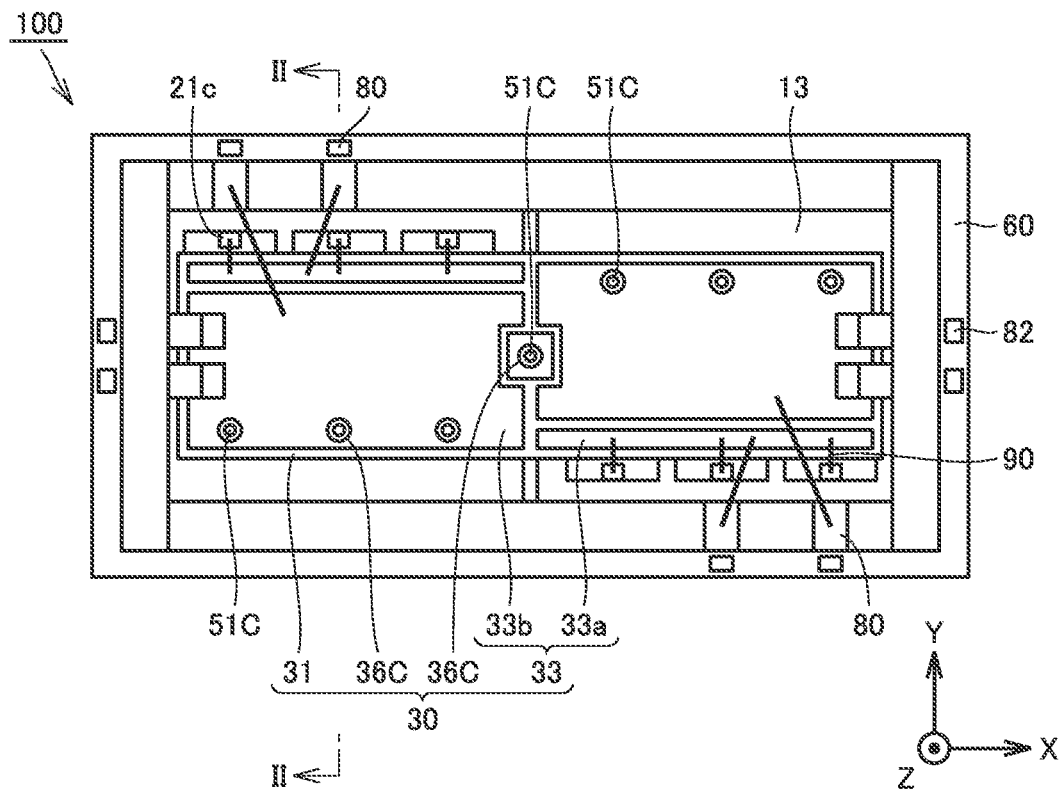
FIG. 1 is a schematic plan view showing a manner of the entire power semiconductor device in a two-dimensional view in a first example of a first embodiment.
Figure 2:
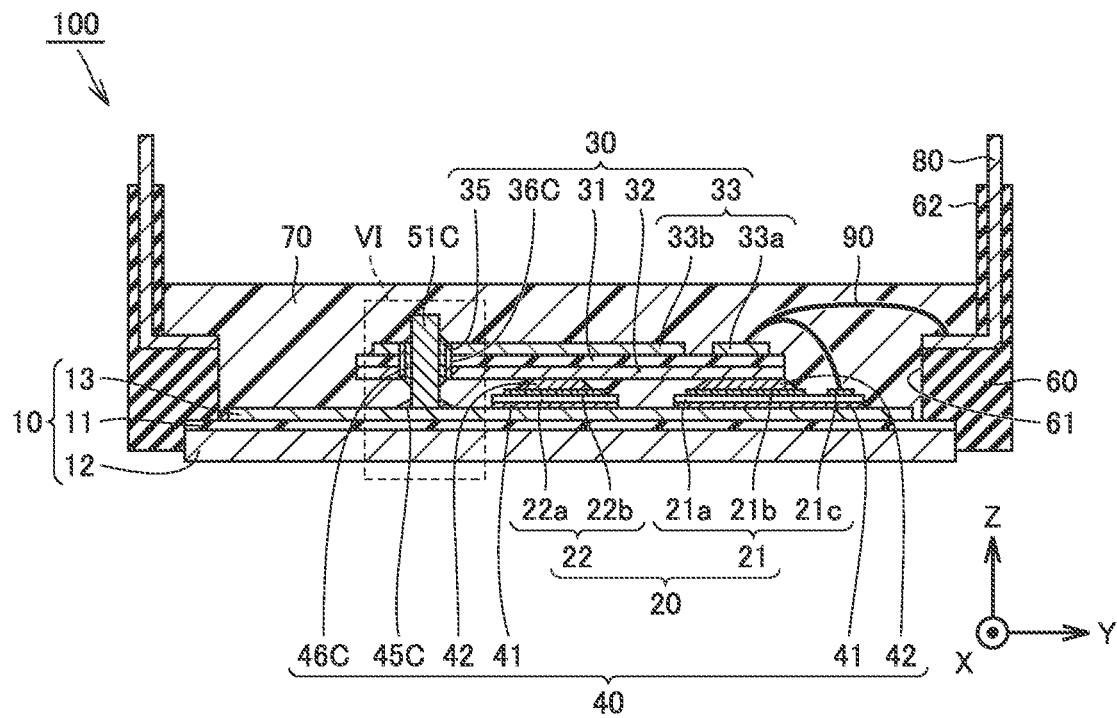
FIG. 2 is a schematic cross-sectional view of a portion along line II-II in FIG. 1 in the power semiconductor device in the first example of the first embodiment.
Figure 5:
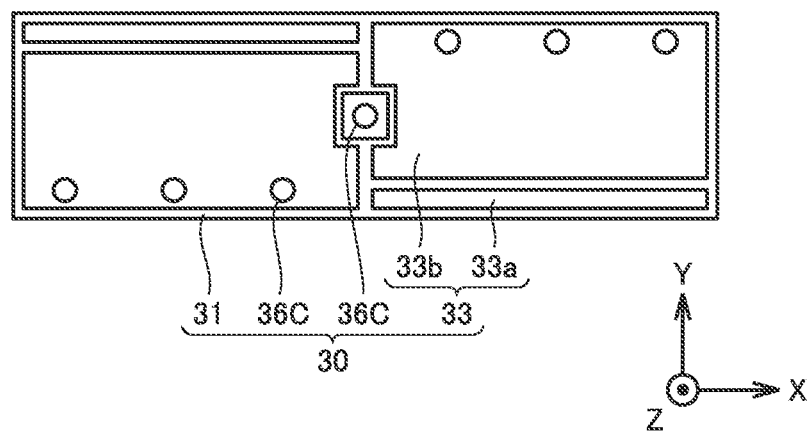
FIG. 5 is a schematic plan view specifically showing a manner of the core member and a conductor layer on the upper side in the Z direction of the printed circuit board in the power semiconductor device in FIG. 1.
Figure 6:
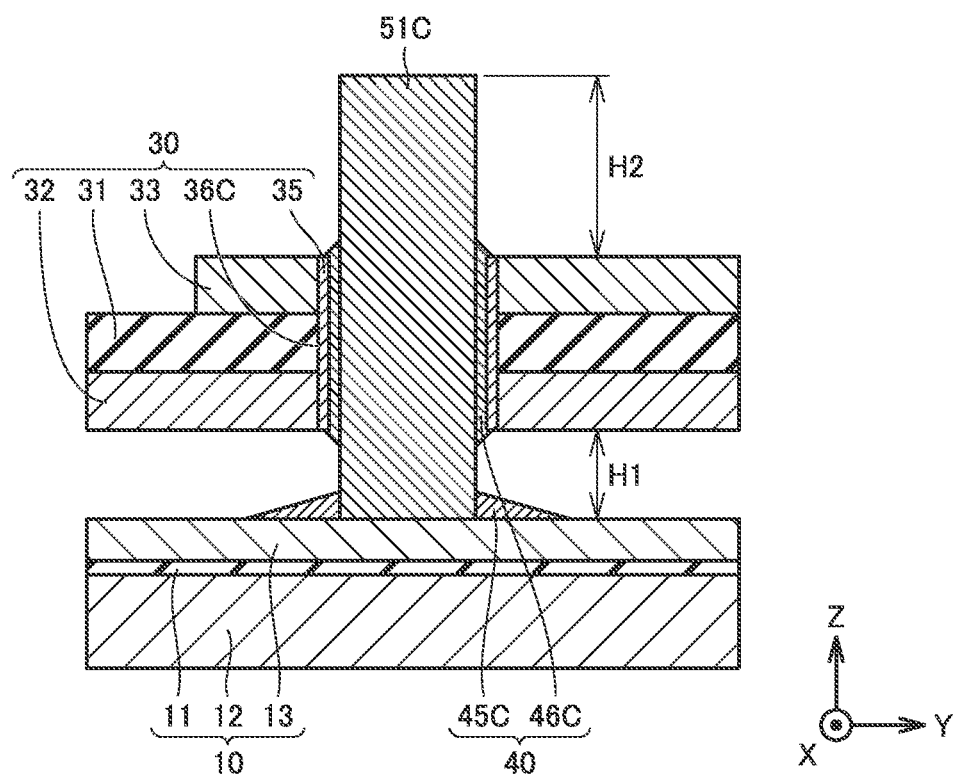
FIG. 6 is a schematic enlarged cross-sectional view of a portion VI surrounded by a dotted line in FIG. 2 in the first example of the first embodiment.

First of all, a configuration of a power semiconductor device in a first example of the present embodiment is described with reference to FIG. 1 to FIG. 6. X direction, Y direction, and Z direction are introduced for convenience of explanation. FIG. 1 is a schematic plan view showing a manner of the entire power semiconductor device in a two-dimensional view in the first example of the first embodiment. FIG. 2 is a schematic cross-sectional view of a portion along line II-II in FIG. 1 in the power semiconductor device in the first example of the first embodiment. FIG. 3 is a schematic plan view specifically showing a portion having semiconductor elements in the power semiconductor device in FIG. 1. FIG. 4 is a schematic plan view specifically showing a manner of a core member and a conductor layer on the lower side in the Z direction of a printed circuit board in the power semiconductor device in FIG. 1. FIG. 5 is a schematic plan view specifically showing a manner of the core member and a conductor layer on the upper side in the Z direction of the printed circuit board in the power semiconductor device in FIG. 1. FIG. 6 is a schematic enlarged cross-sectional view of a portion VI surrounded by a dotted line in FIG. 2 in the first example of the first embodiment. In the following, the lower side with respect to the Z direction, that is, the negative side in the Z direction is simply referred to the lower side or below, and the upper side with respect to the Z direction, that is, the positive side in the Z direction is simply referred to as the upper side or above. In the following, the positive side or the negative side with respect to the X and Y directions extending in the horizontal direction in the drawings is simply referred to as the left side or the right side.

Referring to FIG. 1 and FIG. 2, a power semiconductor device 100 in the first example of the present embodiment mainly includes an insulating substrate 10, semiconductor chips 20, a printed circuit board 30, a conductive member 40, metal column portions 51C, a case 60, a sealing resin 70, external electrode terminals 80, and metal wires 90. Insulating substrate 10 is a flat plate-shaped member, for example, having a rectangular shape in a two-dimensional view. Insulating substrate 10 has an insulating layer 11, a fourth conductor layer 12, and a third conductor layer 13.

Insulating layer 11 has a thickness of 0.125 mm, for example. Insulating layer 11 is, for example, an insulating sheet made of resin. However, insulating layer 11 is not limited thereto and may be formed of, for example, a ceramic material selected from the group consisting of AlN (aluminum nitride), alumina, and SiN (silicon nitride). Fourth conductor layer 12 is bonded to the lower-side surface of insulating layer 11. Fourth conductor layer 12 has a thickness of 2 mm, for example. Third conductor layer 13 is arranged so as to be bonded to the upper-side surface of insulating layer 11, that is, on the surface of insulating substrate 10 on the printed circuit board 30 side that is the upper side. Third conductor layer 13 has a thickness of 0.5 mm, for example. Fourth conductor layer 12 and third conductor layer 13 are formed of, for example, copper.

Referring to FIG. 3, third conductor layer 13 has, for example, a rectangular shape in a two-dimensional view, and a plurality of third conductor layers 13 are arranged so as to be aligned at a distance from each other with respect to the X direction. Two third conductor layers 13 are arranged at a distance from each other with respect to the X direction in FIG. 3, but the number and the manner of arrangement of third conductor layers 13 are not limited thereto. As shown in FIG. 3, for example, third conductor layer 13 on the right side of the two may partially protrude toward the left side from the other region at the middle portion of insulating substrate 10 in the left-side region. Correspondingly, third conductor layer 13 on the left side of the two may be partially recessed toward the left side from the other region at the middle portion of insulating substrate 10 in the right-side region. In FIG. 3, the protruding portion of third conductor layer 13 on the right side is fitted in the recessed portion of third conductor layer 13 on the left side. Such a configuration may be employed. Fourth conductor layer 12 may have or may not have a two-dimensional shape similar to that of third conductor layer 13.

Semiconductor chips 20 include, for example, an IGBT as semiconductor element 21 and a diode 22 as another element different from semiconductor element 21. These semiconductor chips 20, that is, semiconductor elements 21 and diodes 22 are bonded on one main surface, that is, the upper-side main surface of insulating substrate 10. More specifically, a plurality of semiconductor elements 21 and diodes 22 are bonded to the upper surface of third conductor layer 13 at a distance from each other with respect to the X direction and the Y direction. It is preferable that, for example, FWDs are used as the diodes. Here, IGBTs are illustrated as semiconductor elements 21 by way of example. However, instead of IGBTs, for example, MOSFETs (Metal Oxide Semiconductor Field Effect Transistors) may be used as semiconductor elements 21.

In FIG. 3, three semiconductor elements 21 and three diodes 22 are bonded so as to be aligned in a row on each of two third conductor layers 13 on insulating substrate 10. That is, in FIG. 3, semiconductor elements 21 and diodes 22 are arranged in a pair, that is, 1 in 1 to form a module. However, the number and the manner of arrangement of semiconductor elements 21 and diodes 22 are not limited. For example, semiconductor elements 21 and diodes 22 may be arranged in two pairs, 2 in 1, or in six pairs, 6 in 1. Furthermore, the configuration above, a power semiconductor element serving as a converter, and a power semiconductor element serving as a brake may be mounted.

FIG. 3 schematically illustrates semiconductor element 21 having one main electrode 21b and one signal electrode 21c on a chip body 21a. That is, main electrode 21b and signal electrode 21c are formed in semiconductor element 21. Main electrode 21b is, for example, an emitter electrode, and signal electrode 21c is, for example, a gate electrode. FIG. 3 schematically illustrates diode 22 having one electrode 22b on a chip body 22a.

Semiconductor element 21 has chip body 21a, for example, 8 mm in length, 8 mm in width, and 0.08 mm in thickness. Diode 22 has chip body 22a, for example, 6 mm in length, 8 mm in width, and 0.08 mm in thickness. On the upper surface of semiconductor element 21 as an IGBT, a gate electrode is formed as signal electrode 21c, for example, 1 mm in length and 2 mm in width. The number and the manner of arrangement of main electrodes 21b, signal electrodes 21c, and electrodes 22b of diodes 22 are not limited to those described above. All of these main electrode 21b, signal electrode 21c, and electrode 22b are metal thin films, for example, formed of gold. When semiconductor element 21 is a MOSFET, a source electrode is arranged as main electrode 21b and a gate electrode is arranged as signal electrode 21c on the chip body.

Referring to FIG. 4 and FIG. 5, printed circuit board 30 is a flat plate-shaped member, for example, having a rectangular shape in a two-dimensional view. As shown in FIG. 2, printed circuit board 30 is bonded to the upper side of semiconductor element 21 that is, for example, an IGBT, and diode 22 so as to face semiconductor element 21 and diode 22. Specifically, solder layers 41 are arranged on the lower surfaces of semiconductor element 21 and diode 22, and third conductive members 42 that are solder layers are arranged on the upper surfaces thereof. Semiconductor element 21 and diode 22 are bonded to third conductor layer 13 of insulating substrate 10 therebelow through solder layers 41. Semiconductor element 21 and diode 22 are bonded on the upper side of first conductor layer 32 described later of printed circuit board 30 thereabove through third conductive members 42. In other words, main electrode 21b and printed circuit board 30 are connected through third conductive member 42. Both of solder layer 41 and third conductive member 42 are included in conductive member 40 described above.

Solder layer 41 has a thickness of, for example, about 0.1 mm. Third conductive member 42 has a thickness, for example, about 0.4 mm. Solder layer 41 and third conductive member 42 are formed of, for example, a Sn—Ag—Cu-based solder material. However, here, at least one of solder layer 41 and third conductive member 42 is not limited to a Sn—Ag—Cu-based solder and may be formed of any other kind of solder. Alternatively, third conductive member 42 may be formed of a conductive material other than solder. Furthermore, instead of solder layer 41, a conductive material other than solder may be used. For example, instead of solder layer 41 and third conductive member 42, a conductive adhesive including a silver filler dispersed in epoxy resin, or silver nanopowder or copper nanopowder in which nanoparticles are baked at low temperatures may be used as the conductive member. When the conductive member is formed of these materials, a bonding effect similar to when solder layer 41 and third conductive member 42 are formed is achieved.

Insulating substrate 10 is bonded to the lower side of semiconductor chip 20 in this way. Insulating substrate 10 thus allows electrical connection to a not-shown electrode on the lower-side surface of semiconductor chip 20. The further detail of conductive member 40 will be described later.

Referring to FIG. 1, the maximum area of the rectangle in a two-dimensional view of printed circuit board 30 may be smaller than the maximum area of the rectangle in a two-dimensional view of insulating substrate 10. Conversely, the maximum planar area of printed circuit board 30 may be larger than that of insulating substrate 10, or both may be substantially the same. It is preferable that printed circuit board 30 is arranged such that the center point of its rectangular two-dimensional shape is substantially matched with the center point of the rectangular two-dimensional shape of insulating substrate 10. However, the center point of the two-dimensional shape of printed circuit board 30 is not necessarily matched with the center point of the two-dimensional shape of insulating substrate 10. The distance, for example, in the X direction between those center points may be, for example, 5% or less of the maximum dimension in the X direction of printed circuit board 30 or may exceed 5%. The dimension in the Y direction is similar to that in the X direction. As used herein "the center point of insulating substrate 10" means the intersection of the diagonal lines of the rectangular shape in a two-dimensional view of insulating substrate 10. When insulating substrate 10 has a two-dimensional shape other than a rectangular shape, the center point of insulating substrate 10 means the position of its barycenter.

Referring to FIG. 2, printed circuit board 30 includes a core member 31, a first conductor layer 32, and a second conductor layer 33. First conductor layer 32 is formed on a first main surface on the semiconductor element 21 side of core material 31, that is, the lower side of core member 31 closer to semiconductor chip 20. Second conductor layer 33 is formed on a second main surface on the opposite side to the first main surface of core material 31, that is, on the upper side of core member 31 farther from semiconductor chip 20. As described above, first conductor layer 32 is bonded to semiconductor element 21 and diode 22 through third conductive member 42. Printed circuit board 30 therefore is arranged along the main surface of semiconductor chip 20 so as to face the upper side of semiconductor element 21 and the like mounted on insulating substrate 10.

Core member 31 has a thickness of 0.5 mm, for example. Core member 31 is, for example, an insulating material that is a material called FR-4 (Flame Retardant Type 4). First conductor layer 32 and second conductor layer 33 each have a thickness of, for example, 0.4 mm and are formed of, for example, copper.

As shown in FIG. 4, for example, two first conductor layers 32 having a relatively large planar area are arranged at a distance from each other, for example, in the X direction. The two first conductor layers 32 are line-symmetric to each other with respect to a not-shown middle line extending through the middle in the X direction in the top-bottom direction in the drawing, that is, the depth direction. Of these two first conductor layers 32, the one on the left side in FIG. 4 is depressed at the rightmost side, that is, the outer edge toward the left side in FIG. 4 in the vicinity of the middle of printed circuit board 30. Of these two first conductor layers 32, the one on the right side in FIG. 4 is depressed at the leftmost side, that is, the outer edge toward the right side in FIG. 4 in the vicinity of the middle of printed circuit board 30. The respective recessed portions of these two first conductor layers 32 are opposed to each other with respect to the X direction and surround the middle portion in a two-dimensional view of printed circuit board 30.

The sides of these two first conductor layers 32 form a rectangular shape, excluding the depressed portion. As shown in FIG. 4, the upper and lower outer edges of two first conductor layers 32 in FIG. 4 may be formed to overlap the outer edges of printed circuit board 30. However, the upper and lower outer edges of two first conductor layers 32 in FIG. 4 may be formed inside of printed circuit board 30 so as not to overlap the outer edges of printed circuit board 30.

One rectangular or square pattern of first conductor layer 32 is formed at the middle portion in a two-dimensional view of printed circuit board 30. The planar area of first conductor layer 32 at the middle portion is smaller than that of the two first conductor layers 32. This first conductor layer 32 at the middle portion is formed as the same layer as each of the two first conductor layers 32.

As described above, the two-dimensional shapes and the arrangement of a total of three first conductor layers 32 shown in FIG. 4 are line-symmetric to each other with respect to, for example, the middle line vertically passing through the middle portion in the X direction in FIG. 4. Furthermore, the two-dimensional shapes of a total of three first conductor layers 32 are line-symmetric to each other with respect to the middle line laterally passing through the middle portion in the Y direction in FIG. 4. Furthermore, the two-dimensional shapes and the arrangement of a total of three first conductor layers 32 are point-symmetric to each other with respect to, for example, the middle point in FIG. 4.

As shown in FIG. 5, two second conductor layers 33 are formed at a distance from each other, for example, in the X direction. Each of these two is further divided into two at a distance from each other in the Y direction. That is, the left half region in FIG. 5 has a non-bonding pad 33b having a relatively large planar area and a bonding pad 33a, as second conductor layer 33. That is, second conductor layer 33 has bonding pad 33a as a part thereof. Bonding pad 33a is arranged on the upper side, that is, the back side in the depth direction of non-bonding pad 33b in the left-side region in FIG. 5. The width in the Y direction of bonding pad 33a is smaller than that of non-bonding pad 33b. Bonding pad 33a is shaped in a rectangle extending longitudinally in the X direction.

The right half region in FIG. 5 also has a non-bonding pad 33b having a relatively large planar area and a bonding pad 33a, as second conductor layer 33. That is, second conductor layer 33 has bonding pad 33a as a part thereof. Bonding pad 33a is arranged on the lower side, that is, the front side in the depth direction of non-bonding pad 33b in the right-side region in FIG. 5. The width in the Y direction of bonding pad 33a is smaller than that of non-bonding pad 33b. Bonding pad 33a is shaped in a rectangle extending longitudinally in the X direction.

As shown in FIG. 5, two non-bonding pads 33b and two bonding pads 33a that form second conductor layer 33 are line-symmetric to each other with respect to a not-shown middle line extending through the middle in the X direction in the top-bottom direction, that is, the depth direction. In these two non-bonding pads 33b, the rightmost side, that is, the outer edge is depressed toward the left side in FIG. 5 in the vicinity of the middle of printed circuit board 30. Of these two non-bonding pads 33b, the one on the right side in FIG. 5 is depressed at the leftmost side, that is, the outer edge toward the right side in FIG. 5 in the vicinity of the middle of printed circuit board 30. The respective recessed portions of these two non-bonding pads 33b are opposed to each other with respect to the X direction and surround the middle portion in a two-dimensional view of printed circuit board 30.

The sides of these two non-bonding pads 33b form a rectangular shape, excluding the depressed portion. As shown in FIG. 5, the uppermost and lowermost outer edges of second conductor layer 33 in FIG. 5 may be formed inside of printed circuit board 30 so as not to overlap the outer edges of printed circuit board 30. However, the upper and lower outer edges of two conductor layers 33 in FIG. 5 may be formed to overlap the outer edges of printed circuit board 30.

One rectangular or square pattern of second conductor layer 33 is formed at the middle portion in a two-dimensional view of printed circuit board 30. Second conductor layer 33 at the middle portion is non-bonding pad 33b having a planar area smaller than that of non-bonding pad 33b of the two second conductor layers 33. Non-bonding pad 33b at this middle portion is formed as the same layer as each of the two large non-bonding pads 33b and the two bonding pads 33a.

As described above, the two-dimensional shapes and the arrangement of a total of five divided second conductor layers 33 shown in FIG. 5 are line-symmetric to each other with respect to, for example, the middle line vertically passing through the middle portion in the X direction in FIG. 5. Furthermore, the two-dimensional shapes of a total of five second conductor layers 33 are line-symmetric to each other with respect to the middle line laterally passing through the middle portion in the Y direction in FIG. 5. Furthermore, the two-dimensional shapes and the arrangement of a total of five second conductor layers 33 are point-symmetric to each other with respect to, for example, the middle point in FIG. 5.

As shown in FIG. 2, it is preferable that at least a part of semiconductor element 21, such as the emitter electrode that is main electrode 21b to which third conductive member 42 adheres, is arranged at a position two-dimensionally overlapping bonding pad 33a. The entire main electrode 21b of semiconductor element 21 to which third conductive member 42 adheres may be arranged at a position two-dimensionally overlapping bonding pad 33a.

In the present embodiment, the connection portion between semiconductor chip 20 and printed circuit board 30 has the following features. As shown in FIG. 2, signal electrode 21c such as the gate electrode of the IGBT and bonding pad 33a are electrically connected by metal wire 90.

As shown in FIG. 2, at least a part of the bonding portion of metal wire 90 bonded to bonding pad 33a, that is, the bonded position is arranged at a position opposed in the Z direction to third conductive member 42 connecting main electrode 21b of semiconductor element 21 and first conductor layer 32. That is, at least a part of the position on bonding pad 33a where metal wire 90 is bonded is arranged at a position of semiconductor element 21 two-dimensionally overlapping third conductive member 42. The entire position on bonding pad 33a where metal wire 90 is bonded may be arranged at a position of semiconductor element 21 two-dimensionally overlapping third conductive member 42. The position of the bonding portion of metal wire 90 is not limited to the position opposed to third conductive member 42 and may be any position on bonding pad 33a.

Referring to FIG. 2 and FIG. 6, core member 31, first conductor layer 32, and second conductor layer 33 that form printed circuit board 30 are partially missing. This partially missing portion is a penetration portion 36C. Penetration portion 36C penetrates core member 31 from the first main surface to the second main surface in the Z direction and further penetrates first conductor layer 32 and second conductor layer 33 two-dimensionally overlapping core member 31, in the Z direction. That is, penetration portion 36C penetrates from the uppermost surface of second conductor layer 33 to the lowermost surface of first conductor layer 32 so as to extend along the Z direction.

A conductor layer may be formed on the inner wall surface of penetration portion 36C. More specifically, a conductor layer bonding portion 35 for electrical continuity between first conductor layer 32 and second conductor layer 33 may be formed on the inner wall surface of penetration portion 36C. That is, in FIG. 2, first conductor layer 32 and second conductor layer 33 have electrical continuity through conductor layer bonding portion 35 on the inner wall surface of penetration portion 36C. Conductor layer bonding portion 35 is formed of a conductor thin film such as copper that electrically and mechanically bonds first conductor layer 32 and second conductor layer 33 on the inner wall surface of penetration portion 36C. More specifically, conductor layer bonding portion 35 is, for example, a copper plating film formed on the inner wall surface of penetration portion 36C, independently of first conductor layer 32 and second conductor layer 33. However, conductor layer bonding portion 35 is not necessarily formed in penetration portion 36C, and a surface of a metal column portion 51C may be in direct contact with the inner wall surface of penetration portion 36C.

Metal column portion 51C passes through the inside of penetration portion 36C so as to extend along the Z direction. Metal column portion 51C is connected to printed circuit board 30 by a first conductive member 46C. That is, both of first conductive member 46C as conductive member 40 and metal column portion 51C are arranged in the inside of penetration portion 36C. In other words, the inside of penetration portion 36C is filled with metal column portion 51C and first conductive member 46C. First conductive member 46C is formed of, for example, solder and fills a region from the side surface of metal column portion 51C to the inner wall surface of penetration portion 36C. Metal column portion 51C and penetration portion 36C, in other words, metal column portion 51C and first conductor layer 32 and second conductor layer 33 of printed circuit board 30 are electrically connected by first conductive member 46.

Metal column portion 51C extends from the uppermost surface of third conductor layer 13 as one main surface of insulating substrate 10, penetrates the inside of penetration portion 36C, and extends beyond the uppermost surface of penetration portion 36C on the opposite side to insulating substrate 10 and to printed circuit board 30 on the opposite side to insulating substrate 10. That is, metal column portion 51C extends to the outside, that is, the upper side of penetration portion 36C along the Z direction. Here, the printed circuit board 30 on the opposite side to insulating substrate 10 is the upper side of second conductor layer 33. Thus, metal column portion 51C penetrates core member 31, first conductor layer 32, and second conductor layer 33 of printed circuit board 30 so as to extend along the Z direction.

It is preferable that metal column portion 51C is formed of copper, in consideration of electrical conductivity, thermal conductivity, and bondability with solder. When penetration portion 36C has a cylindrical shape, it is preferable that metal column portion 51C also has a cylindrical shape. Penetration portion 36C and metal column portion 51C may have a polygonal column shape. However, in view of reducing thermal stress produced at the bonding interface between metal column portion 51C and first conductive member 46, it is more preferable that metal column portion 51C has a cylindrical shape.

Metal column portion 51C may have a portion made of a metal material extending in the form of a tube and may be hollow at its middle portion in a two-dimensional view. Alternatively, metal column portion 51C may be made entirely of a metal material, and the whole including the middle portion in a two-dimensional view may be filled with a metal material.

In FIG. 2 and FIG. 6, conductor layer bonding portion 35 is formed on the inner wall surface of penetration portion 36C, and conductor layer bonding portion 35 is sandwiched between first conductive member 46C and penetration portion 36C. However, here, this configuration is also described as "metal column portion 51C is connected to printed circuit board 30 in the inside of penetration portion 36C". This configuration also may be described as "metal column portion 51C is bonded or in contact with printed circuit board 30 in the inside of penetration portion 36C". The lower side of metal column portion 51C reaches the uppermost surface of insulating substrate 10. That is, the lowermost portion of metal column portion 51C is in contact with the uppermost surface of third conductor layer 13. Metal column portion 51C and the uppermost surface of insulating substrate 10 are bonded by a second conductive member 45C. Second conductive member 45C as conductive member 40 is also formed of, for example, solder like others. In this way, the lowermost portion of metal column portion 51C and the uppermost surface of third conductor layer 13 are bonded whereby the positional accuracy of printed circuit board 30 in the Z direction is improved.

A plurality of penetration portions 36C and metal column portions 51C in the inside thereof are arranged. It is preferable that a plurality of metal column portions 51C are arranged at positions point-symmetric to each other with respect to the center of insulating substrate 10 in a two-dimensional view. Specifically, three metal column portions 51C and three penetration portions 36C are formed at a distance from each other in the X direction, in the Y-direction end portion in each of two large non-bonding pads 33b on the opposite side to the side opposed to bonding pad 33a adjacent to non-bonding pad 33b in the Y direction. One metal column portion 51C and one penetration portion 36C are also formed so as to include, for example, the center point in a two-dimensional view of printed circuit board 30 in small non-bonding pad 33b at the middle in a two-dimensional view. That is, one metal column portion 51C of a plurality of metal column portions 51C is arranged at the middle of printed circuit board 30 in a two-dimensional view.

As shown in FIG. 2 and FIG. 3, penetration portion 36C and metal column portion 51C, diode 22, and semiconductor element 21 are aligned in this order at a distance from each other with respect to the Y direction. In the left side in FIG. 3 and FIG. 2, penetration portion 36C and metal column portion 51C, diode 22, and semiconductor element 21 are aligned in this order from the negative side to the positive side of the Y direction. In the right side in FIG. 3, semiconductor element 21, diode 22, and penetration portion 36C and metal column portion 51C are aligned in this order from the negative side to the positive side of the Y direction.

Thus, in the example in FIG. 1 to FIG. 6, a total of seven metal column portions 51C and penetration portions 36C are arranged. However, this is illustrated only by way of example and the number and position is not limited thereto as described later. However, it is preferable that a plurality of metal column portions 51C and penetration portions 36C are arranged at positions point-symmetric to each other with respect to the center point of insulating substrate 10 in a two-dimensional view. Furthermore, it is preferable that they are arranged at positions point-symmetric to each other with respect to the center point of printed circuit board 30 in a two-dimensional view. That is, it is preferable that the other metal column portions 51C excluding one metal column portion 51C among a plurality of metal column portions 51C are arranged at positions point-symmetric to each other with respect to the middle, that is, the center point of printed circuit board 30.

Current flows through metal column portions 51C. Three metal column portions 51C are connected to each of two large patterns of first conductor layer 32 in FIG. 4. As long as the current capacity flowing from each pattern of first conductor layer 32 is satisfied, the number of metal column portions 51C connected to each pattern of first conductor layer 32, that is, the number of penetration portions 36C is not limited. The current capacity can be calculated by the product of the current density and the cross section intersecting the extending direction of metal column portion 51C. For example, a case where metal column portion 51C with a circle cross section having a diameter of 2.0 mm is formed of copper will be described. In this case, the current capacity per metal column portion 51C is about 200 A. For example, in a case of power semiconductor device 100 in which current of 600 A flows through each pattern of first conductor layer 32, three metal column portions 51C having a diameter of 2.0 mm are arranged. Three metal column portions 51C connected to first conductor layer 32 having a large planar area in FIG. 4 and second conductor layer 33 respectively correspond to U phase, V phase, and W phase.

Main electrode 21b of semiconductor element 21 and the not-shown surface electrode of diode 22 are connected by conductive member 40. If main electrode 21b such as the emitter electrode and the not-shown surface electrode of diode 22 are connected through metal column portion 51C, large current flows through metal column portion 51C. It is therefore necessary to arrange a plurality of metal column portions 51C to distribute current. When a plurality of metal column portions 51C are arranged, an extremely large number of penetration portions 36C need to be formed at narrow pitches in printed circuit board 30. However, the processing of a large number of penetration portions 36C at narrow pitches is difficult and the required number may be unable to be formed. Then, main electrode 21b and the surface electrode of diode 22 are connected by conductive member 40 as described above, whereby a volume necessary for feeding large current can be easily supplied by conductive member 40.

Because of such a manner, in a two-dimensional view shown in FIG. 1, main electrode 21b and the surface electrode of diode 22 are arranged so as to two-dimensionally overlap printed circuit board 30 and be covered with printed circuit board 30 from above. In a two-dimensional view in FIG. 1, signal electrode 21c is arranged so as not to be covered with printed circuit board 30. When signal electrode 21c and bonding pad 33a are connected by a wire bonding process, it is necessary to provide the distance of 1 mm or more between signal electrode 21c and an end portion that is the outer edge of printed circuit board 30 in order to avoid interference of a bonding tool with printed circuit board 30.

As described above, metal column portion 51C functions as a conductor electrically connecting third conductor layer 13 to first conductor layer 32 and second conductor layer 33 of printed circuit board 30 opposed thereto. That is, third conductor layer 13 of insulating substrate 10 is electrically connected to first conductor layer 32 and second conductor layer 33 of printed circuit board 30 opposed thereto through second conductive member 45, metal column portion 51C, and first conductive member 46 (and conductor layer bonding portion 35).

Metal column portion 51C is controlled such that the gap between third conductor layer 13 and first conductor layer 32 (the distance in the Z direction) has a constant value. The dimensions in the Z direction of a plurality of metal column portions 51C are substantially equal.

In a case of power semiconductor device 100 with a rated voltage of 1200 V or less, it is preferable that the distance in the Z direction between the surface of first conductor layer 32 of printed circuit board 30 and the surface of the electrode (signal electrode 21c, for example) of the semiconductor element that face each other is 0.3 mm or more. As shown in FIG. 6, it is preferable that a length H2 of metal column portion 51C extending on the upper side in the Z direction on the outside of printed circuit board 30 is greater than a length H1 extending on the lower side in the Z direction. Specifically, length H1 is 0.5 mm or shorter. H1 may be a slightly greater than 0.5 mm. By contrast, length H2 is preferably at least 0.5 mm or more. However, it is more preferable that length H2 is for example, 1 mm or more and 3 mm or less, more specifically 1.5 mm or more and 2 mm or less.

Case 60 is arranged so as to surround an outer edge portion of insulating substrate 10 in a two-dimensional view and accommodate semiconductor element 21, diode 22, printed circuit board 30, and the like thereabove. That is, insulating substrate 10 and case 60 form a container-shaped member. Semiconductor element 21, diode 22, printed circuit board 30, and the like are accommodated in the container-shaped member, and the inside of the container-shaped member is filled with sealing resin 70. Sealing resin 70 is formed of, for example, epoxy resin. A part of insulating substrate 10, specifically for example, the lower-side region of fourth conductor layer 12 may be exposed to the outside from the container-shaped member.

Case 60 is bonded to insulating substrate 10, specifically, to the end surfaces of insulating layer 11 and fourth conductor layer 12 and a region of the main surface adjacent to the end surface of fourth conductor layer 12, with a not-shown silicone adhesive. Case 60 is a member containing, for example, PPS (polyphenylene sulfide) as a main component. However, case 60 may be formed of LCP (liquid crystal polymer) having heat resistance higher than PPS.

As shown in FIG. 2, case 60 has a region with a relatively large width in the X direction (and the Y direction not shown) on its lower side and a region with a relatively small width in the X direction (and the Y direction) on its upper side. Case 60 has a groove extending from a case inside surface 61 of the large-width region, passing through the large-width region in the horizontal direction, bending therefrom, and extending in the Z direction along a case inside surface 62 of the small-width region. An external electrode terminal 80 and an external main electrode terminal 82 are arranged so as to be fitted in the groove. External electrode terminal 80 is electrically connected to bonding pad 33a of printed circuit board 30 through metal wire 90. Thus, external electrode terminal 80 is electrically connected to signal electrode 21c. Furthermore, external main electrode terminal 82 is electrically connected to bonding pad 33a of printed circuit board 30 through metal wire 90. Thus, external main electrode terminal 82 is electrically connected to signal electrode 21c. Furthermore, external main electrode terminal 80 is electrically connected to main electrode 21b and signal electrode 21c through metal wire 90.

Figure 7:
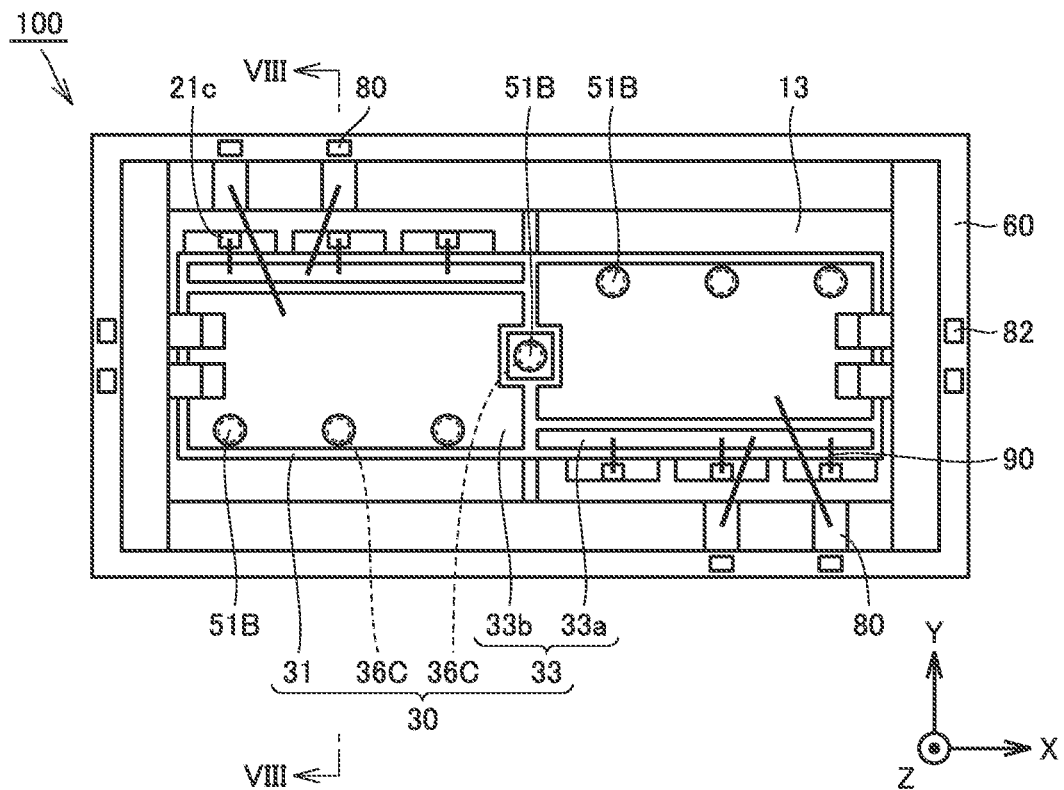
FIG. 7 is a schematic plan view showing a manner of the entire power semiconductor device in a two-dimensional view in a second example of the first embodiment.
Figure 8:
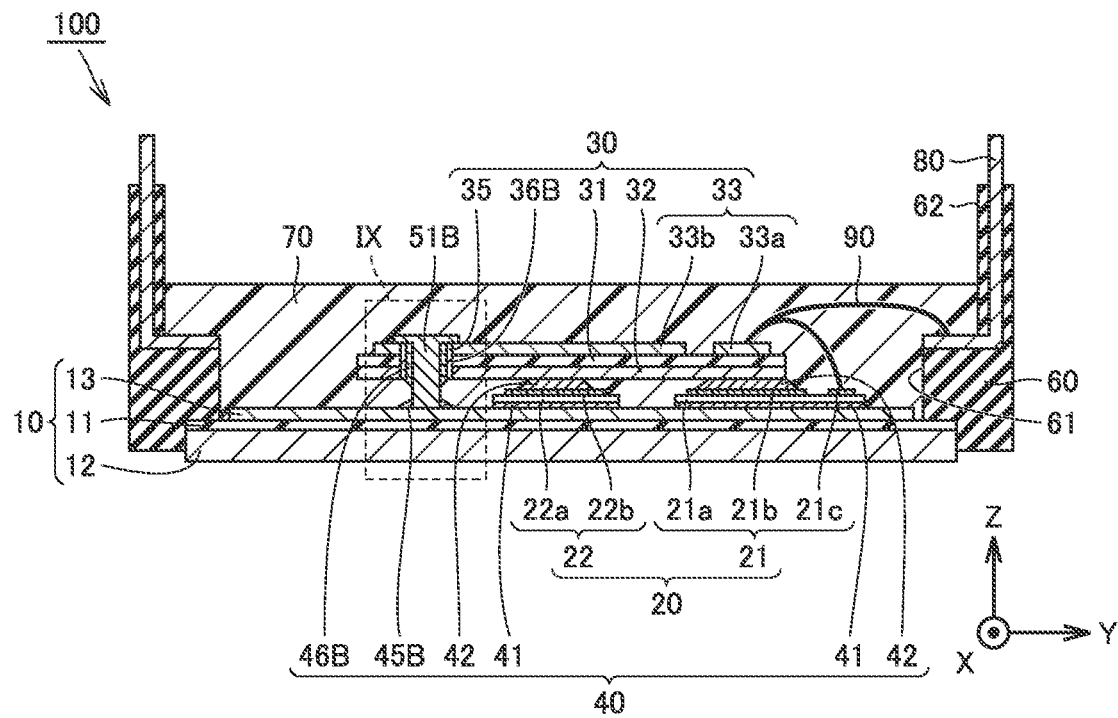
FIG. 8 is a schematic cross-sectional view of a portion along line VIII-VIII in FIG. 7 in the power semiconductor device in the second example of the first embodiment.
Figure 9:
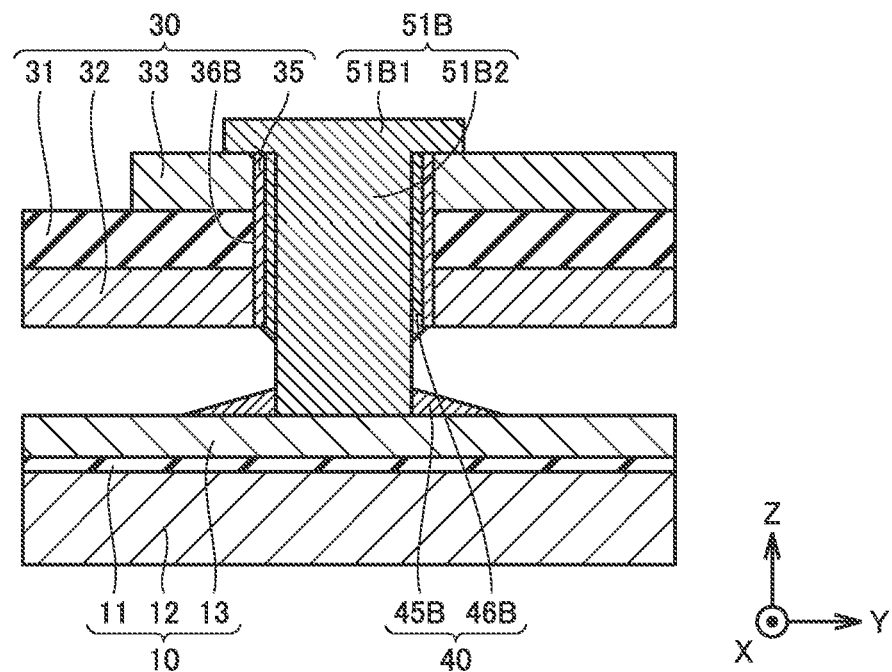
FIG. 9 is a schematic enlarged cross-sectional view of a portion IX surrounded by a dotted line in FIG. 8 in a third example of the first embodiment.

A configuration of a power semiconductor device in a second example of the present embodiment is described with reference to FIG. 7 to FIG. 9. FIG. 7 is a schematic plan view showing a manner of the entire power semiconductor device in a two-dimensional view in the second example of the first embodiment. FIG. 8 is a schematic cross-sectional view of a portion along line VIII-VIII in FIG. 7 in the power semiconductor device in the second example of the first embodiment. FIG. 9 is a schematic enlarged cross-sectional view of a portion IX surrounded by a dotted line in FIG. 8 in a third example of the first embodiment.

Referring to FIG. 7, FIG. 8, and FIG. 9, power semiconductor device 100 in the second example of the present embodiment basically has the same configuration as power semiconductor device 100 in the first example of the present embodiment. The same constituent element is denoted by the same reference sign and a description of particulars common to the first example will not be repeated. Even when the signs are different, the description that is not repeated below is basically similar to that in the first example.

In power semiconductor device 100 in the second example, a partially missing portion of core member 31, first conductor layer 32, and second conductor layer 33 that form printed circuit board 30 is a penetration portion 36B. Although denoted by a different sign, penetration portion 36B has the same shape, position, and the like as penetration portion 36C. Instead of metal column portion 51C, a metal column portion 51B passes through the inside of penetration portion 36B. Metal column portion 51B is connected to printed circuit board 30 through a first conductive member 46B in the inside of penetration portion 36B. The lowermost portion of metal column portion 51B is connected to third conductor layer 13 of insulating substrate 10 by a second conductive member 45B. Although denoted by different signs, the material, arrangement manner, and the like of first conductive member 46B and second conductive member 45B are similar to those of first conductive member 46C and second conductive member 45C.

Metal column portion 51B passes through the inside of penetration portion 36B so as to extend along the Z direction, in the same manner as metal column portion 51C in the first example. Metal column portion 51B extends upward along the Z direction from the inside of penetration portion 36B beyond the uppermost surface of second conductor layer 33 of printed circuit board 30 to the outside of penetration portion 36B.

The shape, the material, and the like of metal column portion 51B are basically similar to those of metal column portion 51C. However, as shown in FIG. 9, metal column portion 51B has a head portion 51B1 and a columnar portion 51B2. Head portion 51B1 is a portion of metal column portion 51B that is arranged outside of penetration portion 36B and expands in the XY direction along one main surface of insulating substrate 10. In other words, head portion 51B1 is a region of metal column portion 51B that extends and expands along the right-left direction in the drawing, that is, the Y direction, on the upper side of second conductor layer 33 in FIG. 9. In other words, head portion 51B1 is a region in which columnar portion 51B2 extending upward in the Z direction extends beyond the upper side in the Z direction of the third main surface of printed circuit board 30 and lies on the outside of penetration portion 36B. Columnar portion 51B2 is a region of metal column portion 51B excluding head portion 51B1. Columnar portion 51B2 is a region extending from (the lowermost surface of) head portion 51B1 along penetration portion 36B so as to include the interior region of penetration portion 36B.

Columnar portion 51B2 has, for example, but not limited to, a cylindrical shape. For example, columnar portion 51B may have a polygonal column shape. Columnar portion 51B2 may have a portion made of a metal material extending in the form of a tube and may be hollow at its middle portion in a two-dimensional view.

Alternatively, columnar portion 51B2 may be made entirely of a metal material, and the whole including the middle portion in a two-dimensional view may be filled with a metal material. Head portion 51B1 is therefore arranged outside of penetration portion 36B so as to connect to one end portion (uppermost portion) in the extending direction of columnar portion 51B2.

In this way, metal column portion 51B differs from metal column portion 51C in the uppermost portion in the Z direction, in particular, the cross-sectional shape of the upper-side region of third conductor layer 13 of insulating substrate 10.

Figure 10:
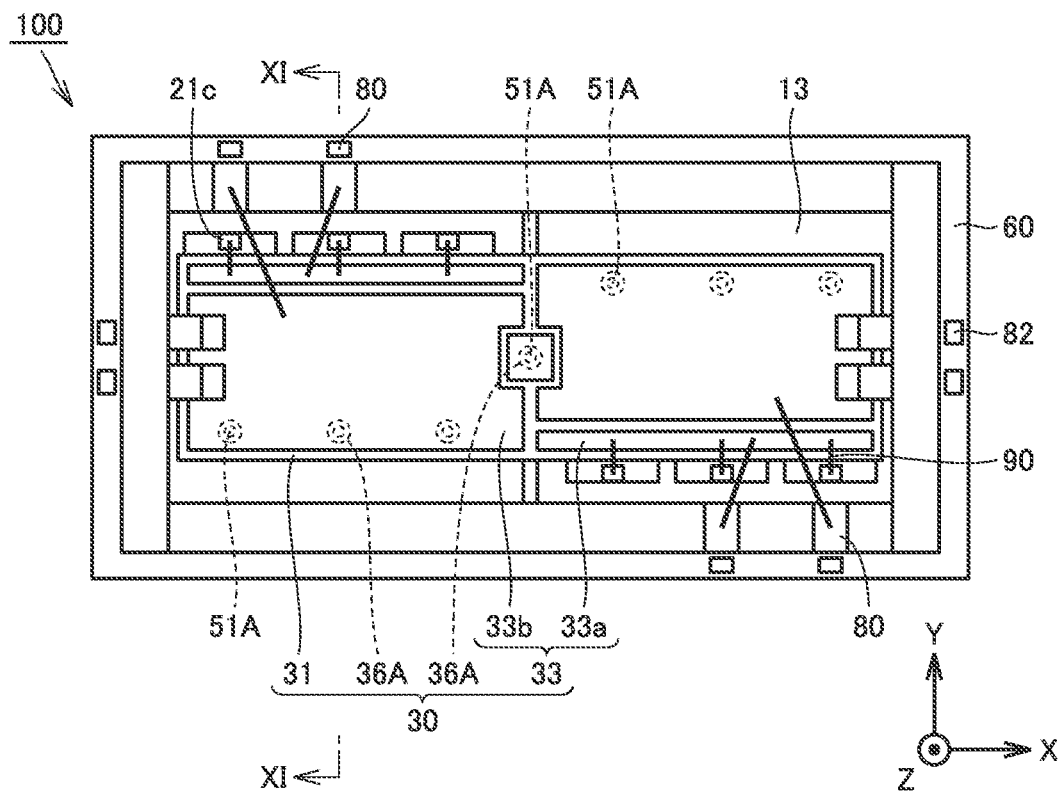
FIG. 10 is a schematic plan view showing a manner of the entire power semiconductor device in a two-dimensional view in the third example of the first embodiment.
Figure 11:
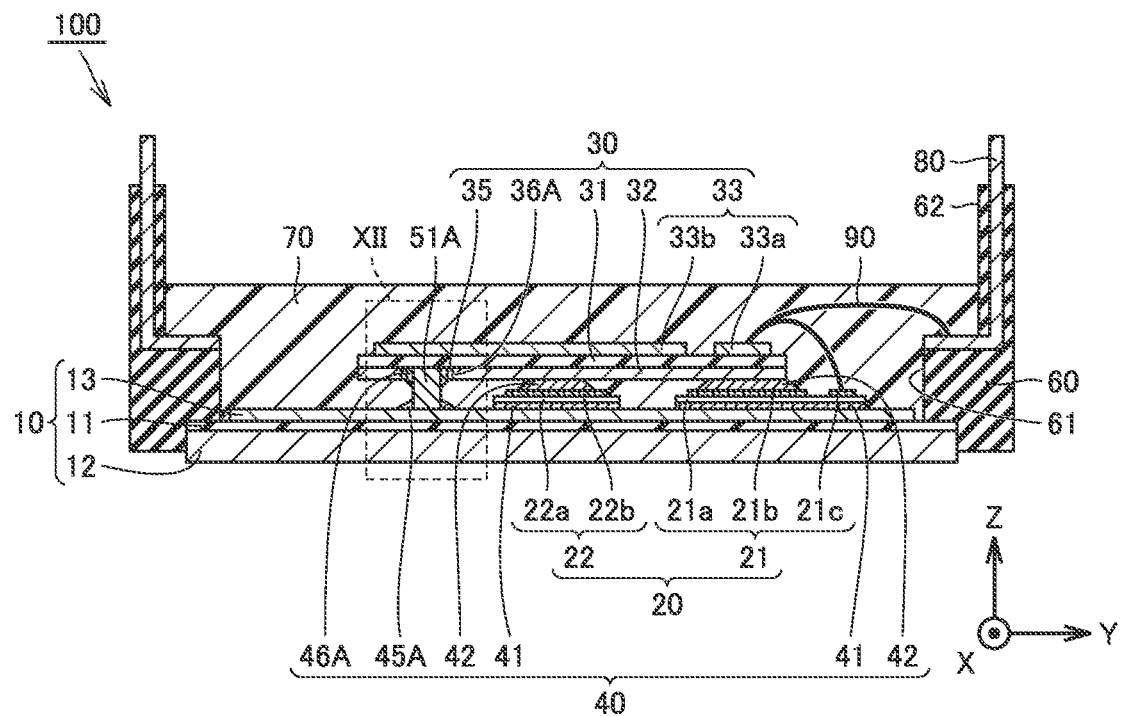
FIG. 11 is a schematic cross-sectional view of a portion along line XI-XI in FIG. 10 in the power semiconductor device in the third example of the first embodiment.
Figure 12:
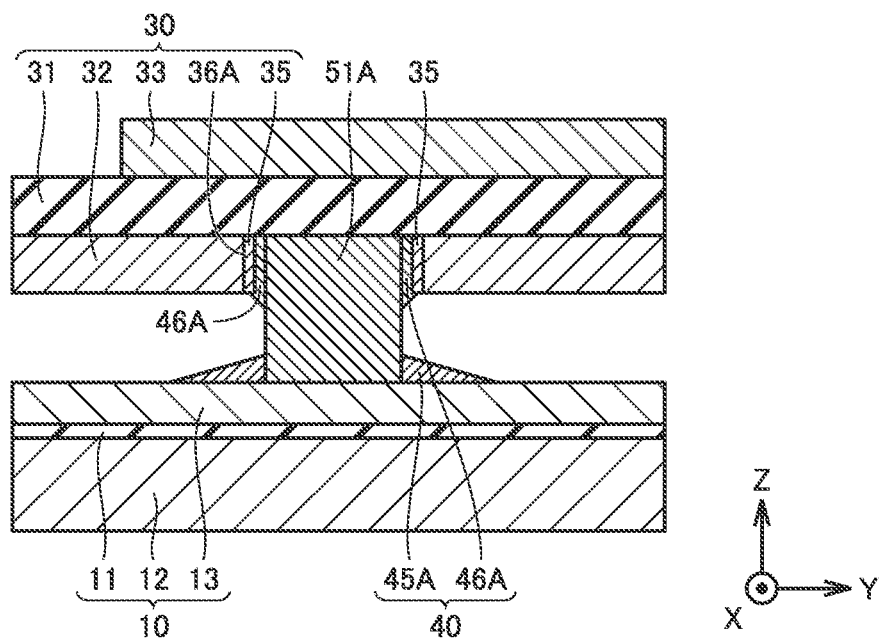
FIG. 12 is a schematic enlarged cross-sectional view of a portion XII surrounded by a dotted line in FIG. 11 in the third example of the first embodiment.

A configuration of a power semiconductor device in the third example of the present embodiment is described with reference to FIG. 10 to FIG. 12. FIG. 10 is a schematic plan view showing a manner of the entire power semiconductor device in a two-dimensional view in the third example of the first embodiment. FIG. 11 is a schematic cross-sectional view of a portion along line XI-XI in FIG. 10 in the power semiconductor device in the third example of the first embodiment. FIG. 12 is a schematic enlarged cross-sectional view of a portion XII surrounded by a dotted line in FIG. 11 in the third example of the first embodiment.

Referring to FIG. 10, FIG. 11, and FIG. 12, power semiconductor device 100 in the third example of the present embodiment basically has the same configuration as power semiconductor device 100 in the first example of the present embodiment. The same constituent element is denoted by the same reference sign and a description of particulars common to the first example will not be repeated. Even when the signs are different, the description that is not repeated below is basically similar to that in the first example.

In power semiconductor device 100 in the third example, a partially missing portion of first conductor layer 32 of printed circuit board 30 is a missing portion 36A. Missing portion 36A is formed at the same position as penetration portions 36B and 36C. However, missing portion 36A is formed so as to penetrate first conductor layer 32 in the region where it is formed such that the first main surface of core member 31 immediately below is exposed.

That is, missing portion 36A is not formed such that core member 31 and second conductor layer 33 are missing. In this way, missing portion 36A penetrates only a part of the Z direction of printed circuit board 30 that connects the first main surface and the second main surface. Missing portion 36A therefore does not penetrate through printed circuit board 30. On the other hand, penetration portion 36B, 36C as a missing portion penetrates through the entire printed circuit board 30 in the Z direction and thereby penetrates all of first conductor layer 32, core member 31, and second conductor layer 33. In this respect, the third example differs from the first example and the second example.

Instead of metal column portion 51C, a metal column portion 51A passes through the inside of missing portion 36A. Metal column portion 51A is connected to printed circuit board 30 through a first conductive member 46A in the inside of missing portion 36A. The lowermost portion of metal column portion 51A is connected to third conductor layer 13 of insulating substrate 10 by a second conductive member 45A. The material of first conductive member 46A and second conductive member 45A is similar to that of first conductive member 46C and second conductive member 45C.

Metal column portion 51A passes through the inside of missing portion 36A so as to extend along the Z direction. Metal column portion 51A extends downward along the Z direction from the inside of missing portion 36A to the uppermost surface of third conductor layer 13 of insulating substrate 10.

The material and the like of metal column portion 51A are basically similar to those of metal column portion 51C. Metal column portion 51A may have a portion made of a metal material extending in the form of a tube and may be hollow at its middle portion in a two-dimensional view. Alternatively, metal column portion 51A may be made entirely of a metal material, and the whole including the middle portion in a two-dimensional view may be filled with a metal material.

In this way, metal column portion 51A does not penetrate through printed circuit board 30. In this respect, metal column portion 51A differs from metal column portion 51B and metal column portion 51C.

Figure 13:
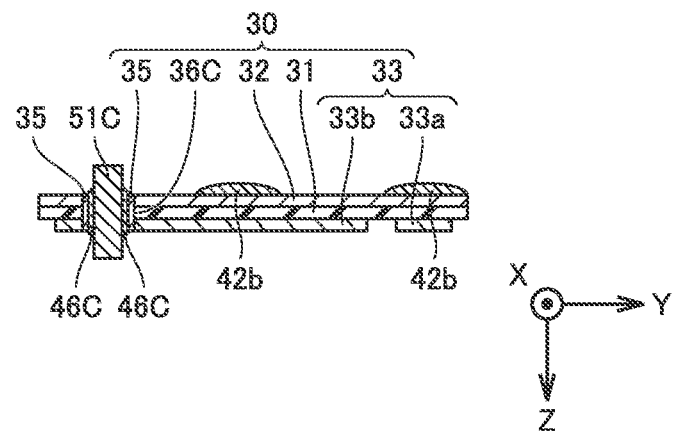
FIG. 13 is a schematic cross-sectional view of the portion along line II-II in FIG. 1, showing a first step of a method of manufacturing a power semiconductor device in the first example of the first embodiment.
Figure 14:
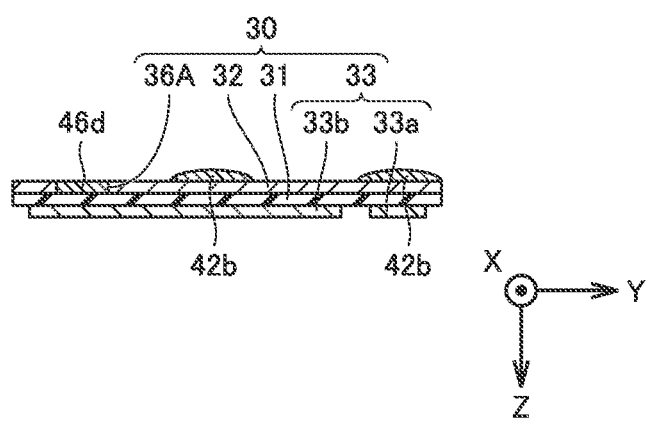
FIG. 14 is a schematic cross-sectional view of the portion along line II-II in FIG. 1, showing the first step of the method of manufacturing a power semiconductor device in the third example of the first embodiment.
Figure 15:
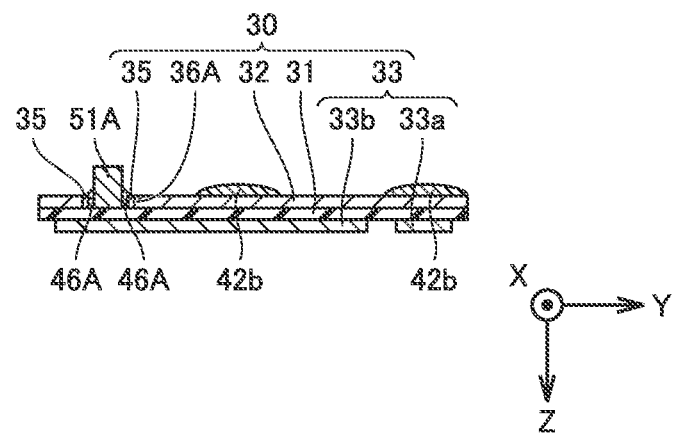
FIG. 15 is a schematic cross-sectional view of the portion along line II-II in FIG. 1, showing a second step of the method of manufacturing a power semiconductor device in the third example of the first embodiment.

Referring now to FIG. 13 to FIG. 18, a method of manufacturing power semiconductor device 100 according to the first embodiment will be described. In the following, in the method of manufacturing power semiconductor device 100, specifically, the step of forming insulating substrate 10 and printed circuit board 30, and bonding insulating substrate 10 and printed circuit board 30 is mainly described. FIG. 13 to FIG. 18 all are schematic cross-sectional views of a portion along line II-II in FIG. 1, in the same manner as FIG. 2. However, unlike the other drawings, FIG. 13 to FIG. 15 are reversed in the Z direction, that is, turned upside down. However, in the step shown in FIG. 13 to FIG. 15, the process may be performed without reversing in the Z direction, in the same manner as in FIG. 16 to FIG. 18.

FIG. 13 is a schematic cross-sectional view of the portion along line II-II in FIG. 1, showing a first step of the method of manufacturing a power semiconductor device in the first example of the first embodiment. Referring to FIG. 13, in the method of manufacturing power semiconductor device 100 in the first example, printed circuit board 30 is prepared which includes core member 31, first conductor layer 32 formed on the first main surface of core member 31, and second conductor layer 33 formed on the second main surface on the opposite side to the first main surface of core member 31. In the prepared printed circuit board 30, a missing portion in which first conductor layer 32 is partially missing is formed. However, in FIG. 13, the missing portion penetrates not only first conductor layer 32 but also the entire printed circuit board 30 in the direction connecting the first main surface and the second main surface. Printed circuit board 30 having penetration portion 36C penetrating all of first conductor layer 32, core member 31, and second conductor layer 33 is thus prepared.

Next, as shown in FIG. 13, metal column portion 51C is inserted into penetration portion 36C. Although not shown, printed circuit board 30 and metal column portion 51C are fixed by a jig such that their mutual position is set. That is, the positional relation of penetration portion 36C and metal column portion 51C in the X direction and the Y direction and the positional relation of metal column portion 51C in the Z direction are set by fixing with the not-shown jig.

With the jig, metal column portion 51C passing through the inside of penetration portion 36C and extending to outside of penetration portion 36C is fixed to printed circuit board 30. In this state, molten solder for forming first conductive member 46C is supplied to the inside of penetration portion 36C, that is, the space surrounded by the inner wall surface of penetration portion 36B (or the surface of conductor layer bonding portion 35, for example, plated with copper on the inner wall surface) and metal column portion 51C. The supplied molten solder naturally solidifies instantaneously. The molten solder thus becomes first conductive member 46C. With first conductive member 46C, metal column portion 51C is bonded in the inside of penetration portion 36C. The molten solder for forming first conductive member 46C is supplied by heating wire solder with a solder iron or a soldering robot.

The foregoing is the step in the case where metal column portion 51C in the first example is bonded to penetration portion 36C. The step in the case where metal column portion 51B in the second example is bonded to penetration portion 36B is generally similar to that of the first example. This is because metal column portion 51B penetrates the inside of penetration portion in the same manner as metal column portion 51C.

FIG. 14 is a schematic cross-sectional view of the portion along line II-II in FIG. 1, showing the first step of the method of manufacturing a power semiconductor device in the third example of the first embodiment. FIG. 15 is a schematic cross-sectional view of the portion along line II-II in FIG. 1, showing the second step of the method of manufacturing a power semiconductor device in the third example of the first embodiment. Referring to FIG. 14 and FIG. 15, in the method of manufacturing power semiconductor device 100 in the third example, printed circuit board 30 including core member 31, first conductor layer 32, and second conductor layer 33 is prepared in the same manner as in FIG. 13. In the prepared printed circuit board 30, missing portion 36A in which first conductor layer 32 is partially missing is formed. However, in FIG. 14, the missing portion penetrates only first conductor layer 32 such that first conductor layer 32 is partially missing.

As described above, in the step of preparing printed circuit board 30 in the present embodiment, penetration portion 36B, 36C or missing portion 36A may be formed after purchase of printed circuit board 30. Alternatively, in the step of preparing printed circuit board 30, printed circuit board 30 in which penetration portion 36B, 36C or missing portion 36A has already been formed may be purchased.

Molten solder 46d for forming first conductive member 46A is supplied into missing portion 36A. In this case, the molten solder is supplied by heating wire solder with a solder iron or a soldering robot in the same manner as described above. In this case, since the molten solder solidifies instantaneously as described above, it is preferable that solder 46d is supplied after metal column portion 51A is arranged so as to pass through the inside of missing portion 36A and extend to the outside of missing portion 36A before supply of solder 46d as shown in FIG. 15. By doing so, metal column portion 51A inserted as shown in FIG. 15 is bonded to missing portion 36A by first conductive member 46A.

However, in the first example, paste solder may be injected as solder 46d, instead of the molten solder. In this case, as shown in FIG. 14, paste solder 46d is injected into missing portion 36A. Thereafter, a reflow process is performed on printed circuit board 30 described above. As shown in FIG. 15, the paste solder 46d thus solidifies as first conductive member 46A. Metal column portion 51A is therefore fixed and bonded to missing portion 36A through first conductive member 46A so as to extend from the inside of missing portion 36A to the outside.

As shown in FIG. 13 and FIG. 15, bump-like solder 42b is formed on a surface serving as the lowermost surface of first conductor layer 32 opposed to main electrode 21b and diode 22. Bump-like solder 42b may be supplied with paste solder by printing or a dispenser on a surface serving as the lowermost surface of first conductor layer 32. Alternatively, bump-like solder 42b may be supplied as solid solder on a surface serving as the lowermost surface of first conductor layer 32. The supplied solder may be formed as solid bump-like solder 42b in the reflow process on printed circuit board 30. The step of forming bump-like solder 42b may be performed before the step of bonding the metal column portion to the missing portion or the penetration portion.

Figure 16:
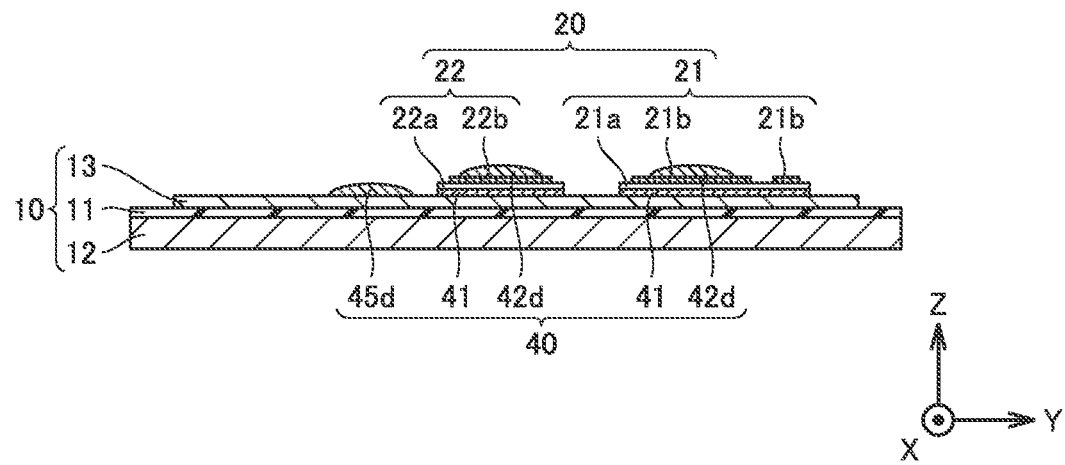
FIG. 16 is a schematic cross-sectional view of the portion along line II-II in FIG. 1, showing the second step of the method of manufacturing a power semiconductor device in the first example of the first embodiment.

FIG. 16 is a schematic cross-sectional view of the portion along line II-II in FIG. 1, showing the second step of the method of manufacturing a power semiconductor device in the first example of the first embodiment. Referring to FIG. 16, insulating substrate 10 is prepared which includes insulating layer 11, fourth conductor layer 12 formed on its lower-side surface, and third conductor layer 13 formed on its upper-side surface. Semiconductor element 21 having, for example, signal electrode 21c as a gate electrode is bonded on one main surface of insulating substrate 10, that is, on third conductor layer 13. In the step of preparing insulating substrate 10, semiconductor element 21 may be bonded after purchase of insulating substrate 10. Alternatively, in the step of preparing insulating substrate 10, insulating substrate 10 having semiconductor element 21 already bonded thereto may be purchased. On this third conductor layer 13, diode 22 is bonded at a distance from semiconductor element 21. In this way, semiconductor element 21 and diode 22 as semiconductor chips 20 are bonded on third conductor layer 13 of insulating substrate 10 with solder layer 41 as conductive member 40. That is, in a state in which semiconductor element 21 and diode 22 are mounted on third conductor layer 13, for example, with paste solder as solder layer 41 interposed, semiconductor chips 20 are fixed and bonded with solder layer 41 subjected to a reflowing process and solidified.

Next, as shown in FIG. 16, paste solder 42d for forming third conductive member 42 (see FIG. 2) is supplied onto main electrode 21b of semiconductor element 21 by printing or a dispenser. Paste solder 45d for forming second conductive member 45C is supplied onto third conductor layer 13 of insulating substrate 10.

The step in FIG. 16 may be performed after the step in FIG. 13 to FIG. 15 or may be performed before the step in FIG. 13 to FIG. 15.

Figure 17:
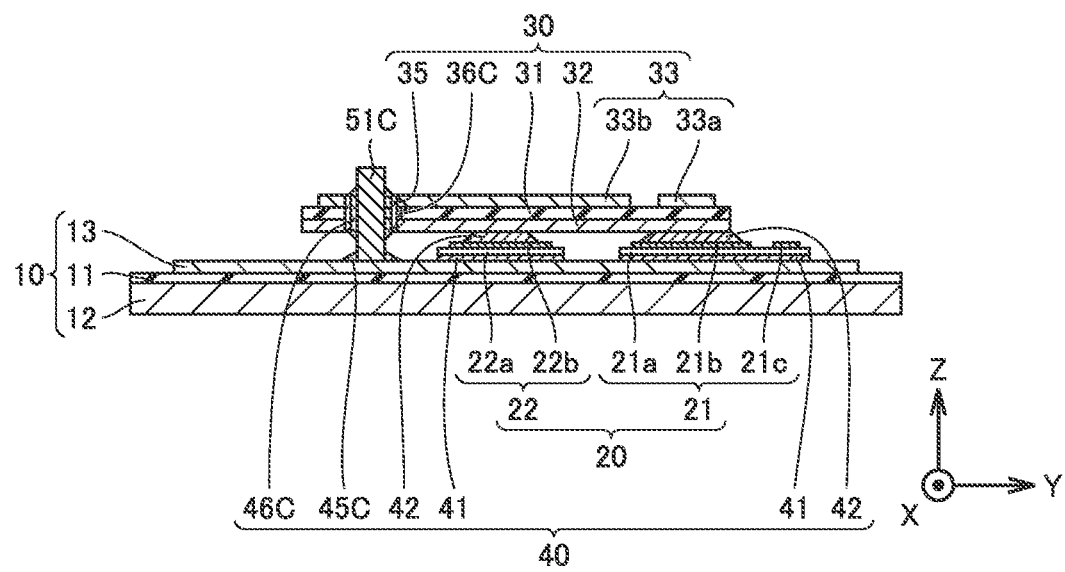
FIG. 17 is a schematic cross-sectional view of the portion along line II-II in FIG. 1, showing a third step of the method of manufacturing a power semiconductor device in the first example of the first embodiment.

FIG. 17 is a schematic cross-sectional view of the portion along line II-II in FIG. 1, showing a third step of the method of manufacturing a power semiconductor device in the first example of the first embodiment. Referring to FIG. 17, printed circuit board 30 turned upside down from the state in FIG. 13 to FIG. 15 is arranged to face the upper side of insulating substrate 10. However, when the step in FIG. 13 to FIG. 15 is performed without turning upside down, unlike the step described above, in FIG. 17, the process is performed with printed circuit board 30 kept as it is without being turned upside down.

In this state, paste solder 45d adheres to the lowermost portion of metal column portion 51C. At the same time, bump-like solder 42b and paste solder 42d adhere. Furthermore, at the same time, paste solder 42d on semiconductor chip 20 adheres to the lowermost portion of first conductor layer 32. The reflow process is performed in this state. Thus, bump-like solder 42b and paste solder 42d are fixed as third conductive member 42, and semiconductor chip 20 and first conductor layer 32 are bonded. At the same time, paste solder 45d is fixed as second conductive member 45C, and metal column portion 51C and third conductor layer 13 are bonded through second conductive member 45C. That is, metal column portion 51C and insulating substrate 10 are bonded by second conductive member 45C. In the step in FIG. 17, metal column portion 51C is arranged so as to extend from third conductor layer 13 that is one main surface of insulating substrate 10, penetrate the inside of penetration portion 36C, and extend to the upper side of penetration portion 36C on the opposite side to insulating substrate 10.

The reason why both of bump-like solder 42b and paste solder 42d are formed for forming third conductive member 42 is as follows. The deformable paste solder 42d can absorb variations in thickness in the Z direction of bump-like solder 42b already solidified. Third conductive member 42 is thus formed to be more uniform in thickness, thereby achieving higher quality of the bonding between semiconductor chip 20 and printed circuit board 30. For the reason above, both of bump-like solder 42b and paste solder 42d are formed. However, conversely, for example, bump-like solder 42b may be formed on insulating substrate 10, and paste solder 42d may be formed on printed circuit board 30.

Figure 18:
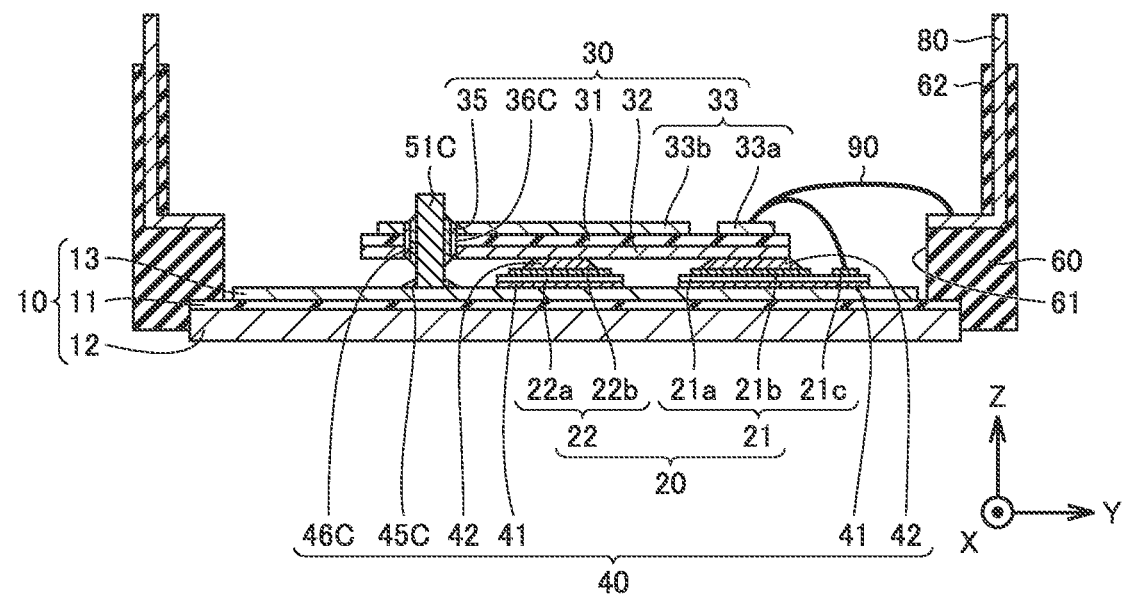
FIG. 18 is a schematic cross-sectional view of the portion along line II-II in FIG. 1, showing a fourth step of the method of manufacturing a power semiconductor device in the first example of the first embodiment.

FIG. 18 is a schematic cross-sectional view of the portion along line II-II in FIG. 1, showing a fourth step of the method of manufacturing a power semiconductor device in the first example of the first embodiment. Referring to FIG. 18, case 60 is arranged on insulating substrate 10. That is, the edges of insulating substrate 10, specifically, insulating layer 11 and fourth conductor layer 12 are fitted and in contact with a groove formed at a lower portion of case 60. Next, case 60 and insulating substrate 10 are fixed by a not-shown thermosetting adhesive. Furthermore, signal electrode 21c and bonding pad 33a are connected by metal wire 90. This connection is made by a well-known wire bonding process. Bonding pad 33a and external electrode terminal 80 are wired by metal wire 90.

Furthermore, although not shown, the region accommodating semiconductor element 21, metal column portion 51C, printed circuit board 30, and the like in the container-shaped member formed with case 60 and insulating substrate 10 is filled with thermosetting sealing resin 70. Sealing resin 70 is heated and hardened. With this heating and hardening, sealing resin 70 seals the inside of the container-shaped member. Thus, power semiconductor device 100 in the manner shown in FIG. 2 is formed.

Although not shown, also in the method of manufacturing power semiconductor device 100 in the first example, a step similar to the step in FIG. 16 to FIG. 18 is performed after the step in FIG. 15.

The operation effect of the present embodiment will now be described.

Power semiconductor device 100 according to the present disclosure includes insulating substrate 10, semiconductor element 21, and printed circuit board 30. Semiconductor element 21 is bonded to one main surface of insulating substrate 10. Printed circuit board 30 is bonded so as to face semiconductor element 21. Semiconductor element 21 has main electrode 21b and signal electrode 21c. Printed circuit board 30 includes core member 31, first conductor layer 32 formed on the first main surface on the semiconductor element 21 side of core member 31, and second conductor layer 33 formed on the second main surface on the opposite side to the first main surface of core member 31. Second conductor layer 33 has bonding pad 33a. Printed circuit board 30 has missing portion 36A, 36B, 36C in which first conductor layer 32 is partially missing. The power semiconductor device further includes metal column portion 51A, 51B, 51C passing through the inside of missing portion 36A, 36B, 36C to reach insulating substrate 10 and connected to printed circuit board 30 by first conductive member 46A, 46B, 46C. Signal electrode 21c and bonding pad 33a are connected by metal wire 90. Metal column portion 51A, 51B, 51C and insulating substrate 10 are bonded by second conductive member 45A, 45B, 45C.

In the method of manufacturing a power semiconductor device according to the present disclosure, insulating substrate 10 having one main surface on which semiconductor element 21 having signal electrode 21c is bonded is prepared. Printed circuit board 30 is prepared which includes core member 31, first conductor layer 32 formed on the first main surface of core member 31, and second conductor layer 33 formed on the second main surface on the opposite side to the first main surface of core member 31, and has missing portion 36A, 36B, 36C in which first semiconductor layer 32 is partially missing. Metal column portion 51A, 51B, 51C passing through the inside of missing portion 36A, 36B, 36C and extending to the outside of missing portion 36A, 36B, 36C is bonded to missing portion 36A, 36B, 36C by first conductive member 46A, 46B, 46C. Printed circuit board 30 is arranged to face semiconductor element 21, and metal column portion 51A, 51B, 51C and insulating substrate 10 are bonded by second conductive member 45A, 45B, 45C. Signal electrode 21c and bonding pad 33a included in second conductor layer 33 are connected by metal wire 90.

Signal electrode 21c and bonding pad 33a are wired by metal wire 90, whereby the productivity is improved compared with, for example, when printed circuit board 30 is electrically connected directly on signal electrode 21c with a small area, for example, through a metal column portion. The operation of aligning the metal column portion or conductive member 40 on signal electrode 21c with an extremely small planar area in an overlapping manner is difficult and may hamper stable production. According to the present disclosure, such difficult operation is eliminated and connection failure between them due to the difficult operation is avoided. This is because with the wire bonding process, metal wire 90 can be stably bonded on signal electrode 21c with a small area.

In the present embodiment, metal column portion 51A to 51C and insulating substrate 10 are bonded by second conductive member 45A to 45C. Bonding the metal column portion to a position on insulating substrate 10 by second conductive member 45A to 45C is easier than bonding on signal electrode 21c. This is because signal electrode 21c has a planar size of 1 mm×2 mm or smaller, whereas a position of at least 2 mm×2 mm or more where the metal column portion can be bonded can be ensured on insulating substrate 10.

In the foregoing power semiconductor device 100, the missing portion is penetration portion 36B, 36C that penetrates through the entire printed circuit board 30 in the Z direction that connects the first main surface and the second main surface and thereby penetrates all of first conductor layer 32, core member 31, and second conductor layer 33. Metal column portion 51B, 51C extends from one main surface of insulating substrate 10, penetrates the inside of penetration portion 36B, 36C, and extends to penetration portion 36B, 36C on the opposite side to insulating substrate 10. Such a configuration may be employed.

In the method of manufacturing power semiconductor device 100 above, the missing portion is penetration portion 36B, 36C that penetrates through the entire printed circuit board 30 in the Z direction that connects the first main surface and the second main surface and thereby penetrates all of first conductor layer 32, core member 31, and second conductor layer 33. In the step of bonding by second conductive member 45A, 45B, 45C, metal column portion 51A to 51C is arranged so as to extend from one main surface of insulating substrate 10, penetrate the inside of missing portion 36A to 36C, and extend to missing portion 36A to 36C on the opposite side to insulating substrate 10. Such a configuration may be employed.

Metal column portion 51B, 51C penetrating through the entire printed circuit board 30 supports printed circuit board 30 thereby suppressing inclination of printed circuit board 30. Therefore, the bonding strength of metal wire 90 on printed circuit board 30 is stabilized, and the reliability and the productivity are improved.

In the power semiconductor device 100 above, main electrode 21b and printed circuit board 30 are connected by third conductive member 42. Such a configuration may be employed. With this configuration, the electrical bonding between main electrode 21b and printed circuit board 30 is performed more reliably.

In the power semiconductor device 100 above, at least a part of main electrode 21b of semiconductor element 21 to which third conductive member 42 adheres is arranged at a position two-dimensionally overlapping bonding pad 33a. Such a configuration may be employed.

Main electrode 21b of semiconductor element 21 is arranged immediately below bonding pad 33a to which metal wire 90 may be bonded, and main electrode 21b is bonded by solder to third conductive member 42 immediately thereabove. Third conductive member 42 immediately below the bonding portion of metal wire 90 suppresses deformation in the Z direction of printed circuit board 30 due to load in the wire bonding process, and ultrasonic energy is stably transmitted to the bonding portion. Therefore, the bonding strength of the bonding portion of metal wire 90 and the shape of the bonding portion are stabilized. The bonding of metal wire 90 in the wire bonding process therefore can be performed stably.

In the power semiconductor device 100 above, at least a part of the position on bonding pad 33a where metal wire 90 is connected is arranged at a position of semiconductor element 21 two-dimensionally overlapping third conductive member 42. Such a configuration may be employed. In this manner, warping of printed circuit board 30 due to load in the wire bonding process is further suppressed. Therefore, the bondability of metal wire 90 on bonding pad 33a is even more stable, and the reliability and the productivity are further improved.

In the power semiconductor device 100 above, a plurality of metal column portions 51A to 51C are arranged. One metal column portion 51A to 51C among a plurality of metal column portions 51A to 51C is arranged at the middle of the printed circuit board in a two-dimensional view. The other metal column portions 51A to 51C excluding one metal column portion 51A to 51C among a plurality of metal column portions 51A to 51C are arranged at positions point-symmetric to each other with respect to the middle of printed circuit board 30. Such a configuration may be employed.

As a result, inclination of printed circuit board 30 relative to insulating substrate 10 can be suppressed. Thus, the bonding strength of metal wire 90 to bonding pad 33a is stabilized, whereby the reliability in temperature cycles during heating and the productivity can be improved.

Furthermore, a plurality of metal column portions 51A to 51C are fixed to penetration portions 36B, 36C and insulating substrate 10 by first conductive members 46A to 46C and second conductive members 45A to 45C. Metal column portion 51A to 51C is arranged in the inside of penetration portion 36B, 36C. The inner wall surface of penetration portion 36B, 36C therefore restricts the position of metal column portion 51A to 51C on the inside. The arrangement position in the X direction and the Y direction of each metal column portion 51A to 51C is thus determined accurately.

In the present embodiment, it is preferable that, for example, all the lengths H2 shown in FIG. 6, that is, the lengths of a plurality of metal column portions 51C protruding from penetration portion 36C to the upper side of second conductor layer 33, for example, in the first example are identical. However, as used herein "identical" includes an error of about 0.05 mm. The position in the Z direction of a plurality of metal column portions 51C is determined by a not-shown jig. However, for example, at least the length H2 of only metal column portion 51C extending in the inside of penetration portion 36C in small non-bonding pad 33b at the middle may be different from those of other metal column portions 51C and, except for this, all of the other metal column portions 51C may have the same length H2.

A plurality of metal column portions 51C are arranged at the same position coordinate with respect to the Z direction. Thus, they function as a jig for supporting printed circuit board 30. The degree of parallelism of printed circuit board 30 to insulating substrate 10 with respect to the horizontal direction, that is, the direction along the XY plane can be improved.

Typically, in the wire bonding process, a bonding tool for applying a load for bonding while transmitting vibration of ultrasound to metal wire 90 is installed substantially vertically to bonding pad 33a as a bonding target. If the installation is not this way, the relation between the transmitted vibration of ultrasound and the applied load is unstable. Accordingly, the bonding strength of metal wire 90 is reduced. If the bonding strength becomes unstable due to the inclination of printed circuit board 30, temperature cycle reliability during heating of power semiconductor device 100 may be reduced or a defective product may be produced. Therefore, substantially equalizing the lengths H2 as described above can reduce the inclination of printed circuit board 30. Substantially equalizing the lengths H2 can also stabilize the bonding strength of metal wire 90 to bonding pad 33a and improve the temperature cycle reliability during heating of power semiconductor device 100 and the productivity. An error in the Z direction dimension of a plurality of metal column portions 51C themselves is preferably 1% or less of a dimension average and more preferably 0.5% or less.

Second Embodiment

Figure 19:
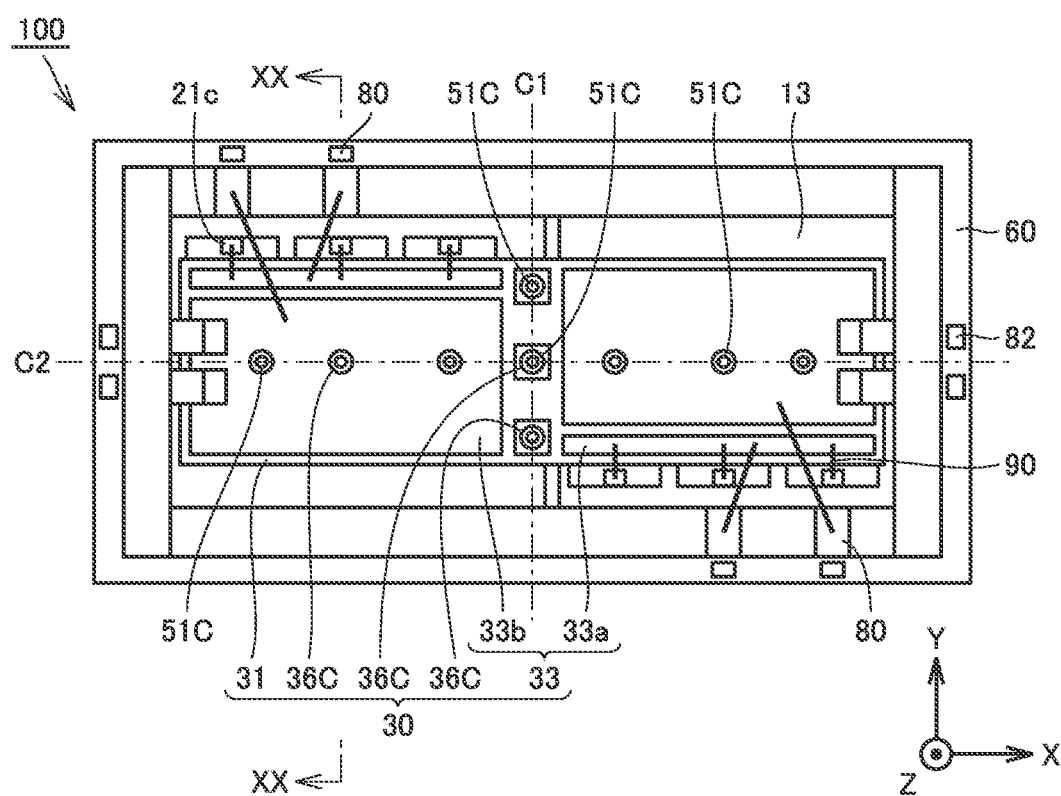
FIG. 19 is a schematic plan view showing a manner of the entire power semiconductor device in a two-dimensional view in a second embodiment.
Figure 20:
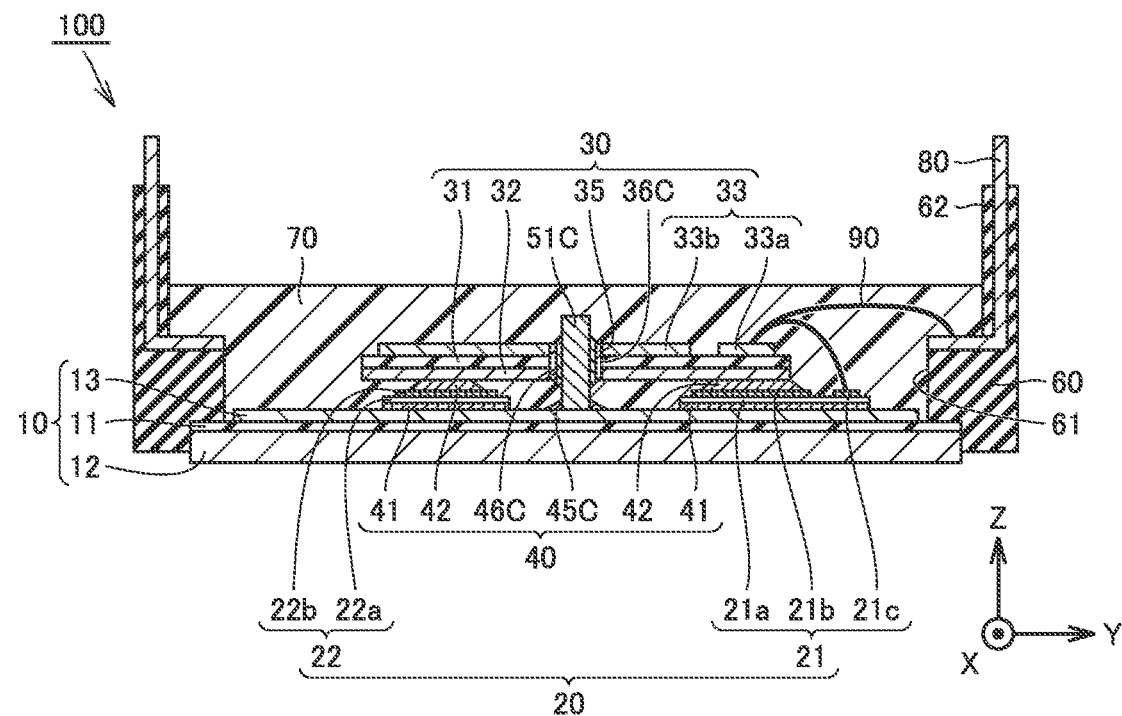
FIG. 20 is a schematic cross-sectional view of a portion along line XX-XX in FIG. 19 in the power semiconductor device in the second embodiment.
Figure 21:
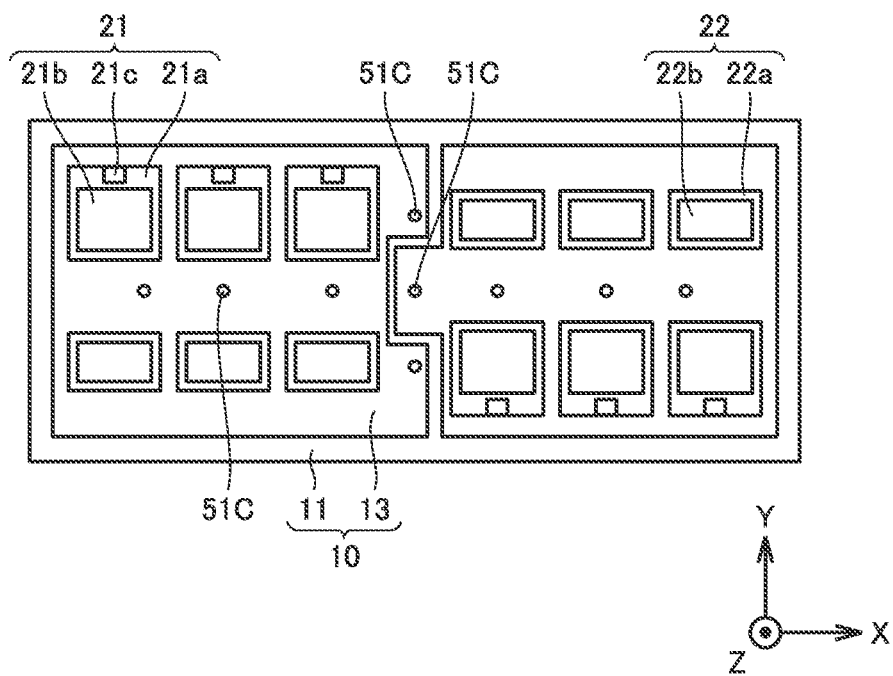
FIG. 21 is a schematic plan view specifically showing a portion having semiconductor elements in the power semiconductor device in FIG. 19.
Figure 22:
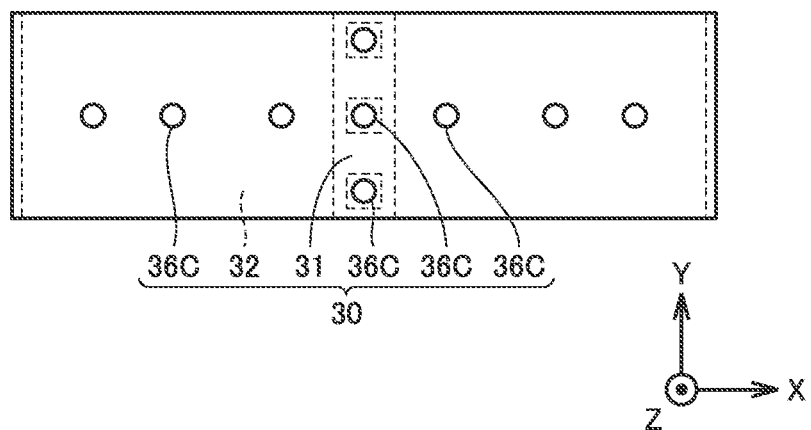
FIG. 22 is a schematic plan view specifically showing a manner of a core member and a conductor layer on the lower side in the Z direction of a printed circuit board in the power semiconductor device in FIG. 19.
Figure 23:
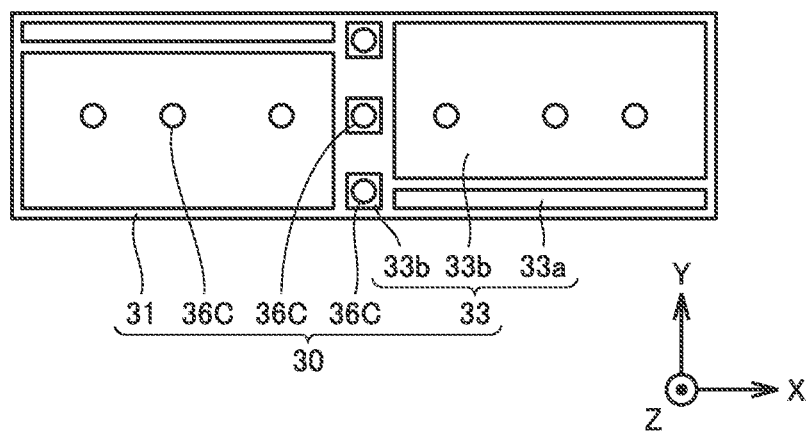
FIG. 23 is a schematic plan view specifically showing a manner of the core member and a conductor layer on the upper side in the Z direction of the printed circuit board in the power semiconductor device in FIG. 19.

First of all, a configuration of a power semiconductor device in the present embodiment is described with reference to FIG. 19 to FIG. 23. FIG. 19 is a schematic plan view showing a manner of the entire power semiconductor device in a two-dimensional view in a second embodiment. FIG. 20 is a schematic cross-sectional view of a portion along line XX-XX in FIG. 19 in the power semiconductor device in the second embodiment. FIG. 21 is a schematic plan view specifically showing a portion having semiconductor elements in the power semiconductor device in FIG. 19. FIG. 22 is a schematic plan view specifically showing a manner of a core member and a conductor layer on the lower side in the Z direction of the printed circuit board in the power semiconductor device in FIG. 19. FIG. 23 is a schematic plan view specifically showing a manner of the core member and the conductor layer on the upper side in the Z direction of the printed circuit board in the power semiconductor device in FIG. 19. FIG. 19 to FIG. 23 correspond to FIG. 1 to FIG. 5 in the first example of the first embodiment.

Referring to FIG. 19 to FIG. 23, power semiconductor device 100 in the present embodiment basically has the same configuration as power semiconductor device 100 in the first example of the first embodiment. The same constituent element is denoted by the same reference sign and a description of particulars common to the first example of the first embodiment will not be repeated. Even when the signs are different, the description that is not repeated below is similar to that in the first example of the first embodiment.

In the present embodiment, among a plurality of metal column portions 51C, some of the other metal column portions 51C excluding one metal column portion 51C arranged at the middle of printed circuit board 30 in a two-dimensional view are arranged to be aligned on a first center line C1 passing through the middle of printed circuit board 30 with respect to the X direction that is the first direction. That is, for example, a total of three penetration portions 36C and three metal column portions 51C on the inside are arranged on first center line C1 at a distance from metal column portion 51C at the middle of printed circuit board 30 in the Y direction. In other words, three metal column portions 51C are arranged on a straight line at a distance from each other in the Y direction.

A total of three metal column portions 51C (the one at the center, that is, at the middle may be excluded) are arranged at positions line-symmetric to each other with respect to a second center line C2 passing through the middle with respect to the Y direction that is the second direction orthogonal to the X direction in a two-dimensional view of printed circuit board 30. In other words, two metal column portions 51C excluding the one at the middle among a total of three are arranged at positions line-symmetric to each other with respect to second center line C2. Therefore, the distance in the Y direction between those adjacent to each other among three metal column portions 51C aligned on first center line C1 is equal.

All of a total of three metal column portions 51C are arranged at positions overlapping non-bonding pad 33b and the pattern of first conductor layer 32 with a small planar area, in the same manner as metal column portion 51C at the middle portion. In FIG. 22 and FIG. 23, therefore, three first conductor layers 32 and three non-bonding pads 33b with a small planar area, similar to those in FIG. 4 and FIG. 5, are formed at the middle portion in the X direction at a distance from each other in the Y direction.

Next, in power semiconductor device 100, three semiconductor elements 21 and three diodes 22 are bonded so as to be aligned in a row on each of two third conductor layers 13 of insulating substrate 10, in the same manner as in FIG. 3. However, the arrangement manner of a plurality of penetration portions 36C and a plurality of metal column portions 51C penetrating through the inside formed in each of two large non-bonding pads 33b is different from that in FIG. 3. Specifically, as shown in FIG. 20 and FIG. 21, three metal column portions 51C and three penetration portions 36C are formed at a distance from each other in the X direction, at the middle region in the Y direction in two-dimensional view in each of two large non-bonding pads 33b. That is, diode 22, penetration portion 36C and metal column portion 51C, and semiconductor element 21 are aligned in this order at a distance from each other with respect to the Y direction. In other words, penetration portion 36C and metal column portion 51C are arranged between semiconductor element 21 and diode 22 with respect to the Y direction. In the left side in FIG. 21 and FIG. 20, diode 22, penetration portion 36C and metal column portion 51C, and semiconductor element 21 are aligned in this order from the negative side to the positive side of the Y direction. In the right side in FIG. 21, semiconductor element 21, penetration portion 36C and metal column portion 51C, and diode 22 are aligned in this order from the negative side to the positive side of the Y direction.

Therefore, a total of six penetration portions 36C and six metal column portions 51C are arranged in portions of two large non-bonding pads 33b. All of these six metal column portions 51C are arranged on second center line C2 at a distance from each other in the X direction. In other words, six metal column portions 51C are arranged on a straight line at a distance from each other in the X direction.

A total of six metal column portions 51C are arranged at positions line-symmetric to each other with respect to first center line C1 passing through the middle with respect to the X direction in a two-dimensional view of printed circuit board 30. In other words, six metal column portions 51C, excluding the one at the middle among a total of three, are arranged at positions line-symmetric to each other with respect to first center line C1. Therefore, among six metal column portions 51C aligned on second center line C2, three on the left side and three on the right side of second center line C2 are at an equal distance from first center line C1 in the X direction.

As described above, a total of nine, namely, three metal column portions 51C on first center line C1 at the middle in the X direction and six metal column portions 51C aligned on second center line C2 at positions overlapping large non-bonding pads 33b are arranged. Also here, it is preferable that a plurality of, for example, a total of nine metal column portions 51C are arranged at positions point-symmetric to each other with respect to the center of insulating substrate 10 in a two-dimensional view. It is also preferable that the other metal column portions 51C excluding one metal column portion 51C at the middle (including the center point) of printed circuit board 30 and insulating substrate 10 among a plurality of metal column portions 51C are arranged at positions point-symmetric to each other with respect to the middle, that is, for example, the center point of printed circuit board 30.

Therefore, as long as the other metal column portions 51C are point-symmetric to each other with respect to the middle of printed circuit board 30, that is, for example, the center point, penetration portion 36C and metal column portion 51C, diode 22, and semiconductor element 21 may be aligned in this order with respect to the Y direction also in the present embodiment, for example, in the same manner as in the first example of the first embodiment.

An example having penetration portion 36C and metal column portion 51C has been described above. However, in FIG. 19 to FIG. 23, instead of penetration portion 36C and metal column portion 51C, penetration portion 36B and metal column portion 51B may be used, or missing portion 36A and metal column portion 51A may be used.

The operation effect of the present embodiment will now be described. The present embodiment achieves the following operation and effect in addition to the operation and effect of the first embodiment.

In power semiconductor device 100 according to the present disclosure, one of a plurality of metal column portions 51A to 51C is arranged at the middle of printed circuit board 30 in a two-dimensional view. The other metal column portions 51A to 51C excluding the one at the middle among a plurality of metal column portions 51A to 51C are arranged at positions point-symmetric to each other with respect to the middle of printed circuit board 30. It is preferable that the present embodiment is based on the premise described above. Furthermore, in this power semiconductor device 100, some metal column portions 51A to 51C among the other metal column portions 51A to 51C excluding the one at the middle are arranged to be aligned on first center line C1 passing through the middle with respect to the X direction that is the first direction in a two-dimensional view of printed circuit board 30. The some metal column portions 51A to 51C are arranged at positions line-symmetric to each other with respect to second center line C2 passing through the middle with respect to the Y direction that is the second direction orthogonal to the X direction in a two-dimensional view of printed circuit board 30. Such a configuration may be employed.

As a result, inclination of printed circuit board 30 relative to insulating substrate 10 can be suppressed. Thus, the bonding strength of metal wire 90 to bonding pad 33a is stabilized, whereby the reliability in temperature cycles and the productivity can be improved.

A plurality of metal column portions 51A to 51C are arranged on first center line C1 so as to be line-symmetric to each other with respect to second center line C2. Thus, the inclination of printed circuit board 30 when mounted on insulating substrate 10 and warping of printed circuit board 30 or insulating substrate 10 due to temperature rise caused by soldering are suppressed. Thus, the bonding strength of metal wire 90 to bonding pad 33a is stabilized, and the reliability of temperature cycles during heating and the productivity can be improved. In addition, since deformation of printed circuit board 30 due to temperature cycles during heating is suppressed, distortion of third conductive member 42 on semiconductor element 21 is reduced, and the reliability of temperature cycles can be improved.

Third Embodiment

Figure 24:
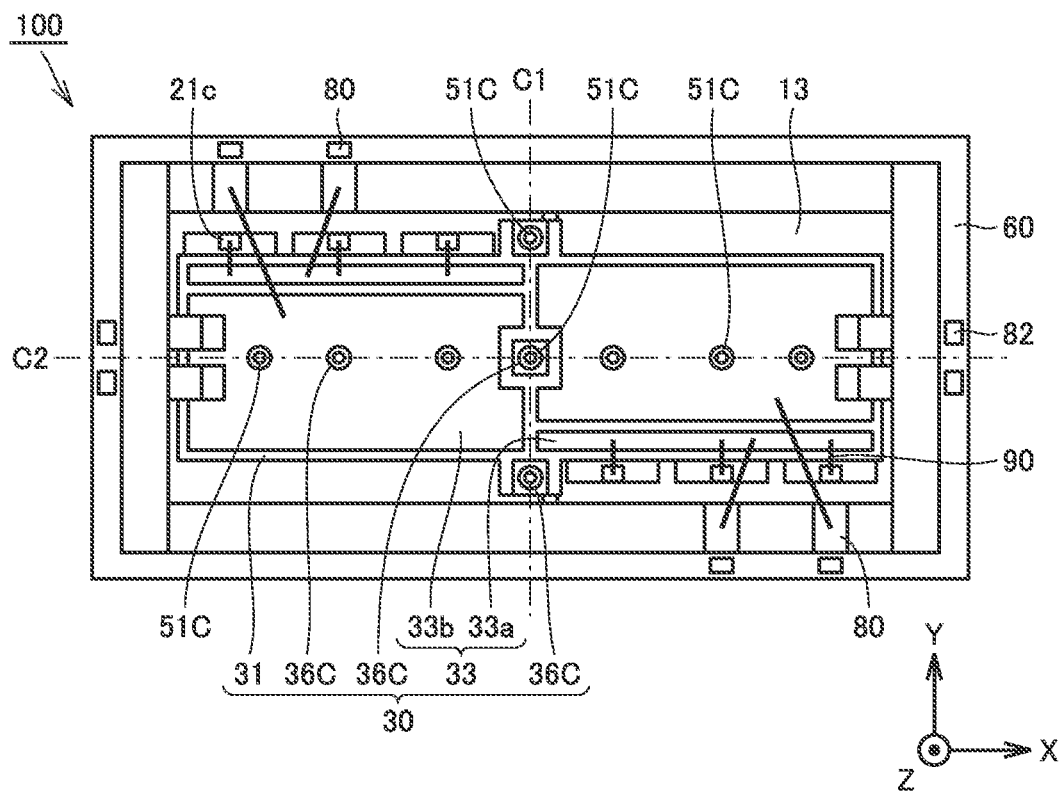
FIG. 24 is a schematic plan view showing a manner of the entire power semiconductor device in a two-dimensional view in a third embodiment.
Figure 25:
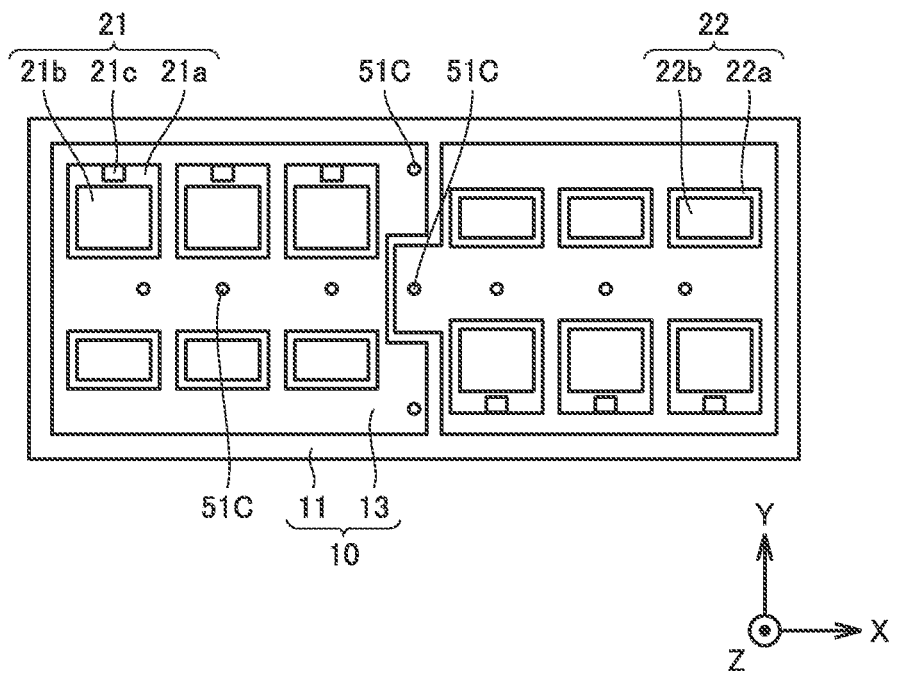
FIG. 25 is a schematic plan view specifically showing a portion having semiconductor elements in the power semiconductor device in FIG. 24.
Figure 26:
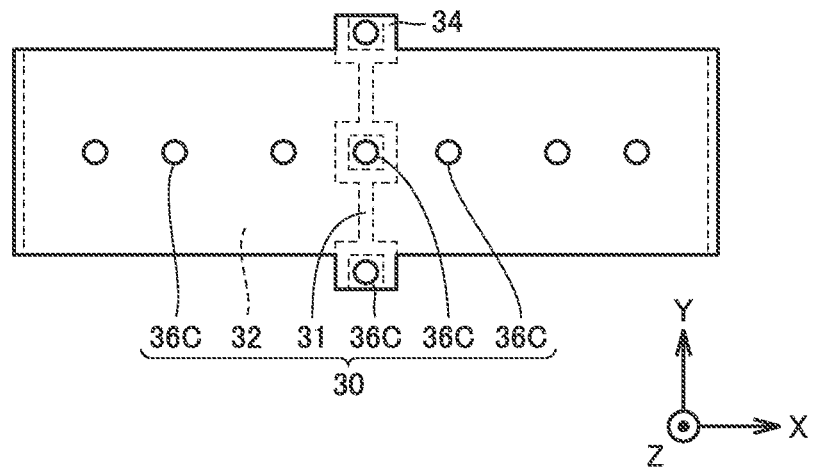
FIG. 26 is a schematic plan view specifically showing a manner of a core member and a conductor layer on the lower side in the Z direction of a printed circuit board in the power semiconductor device in FIG. 24.
Figure 27:
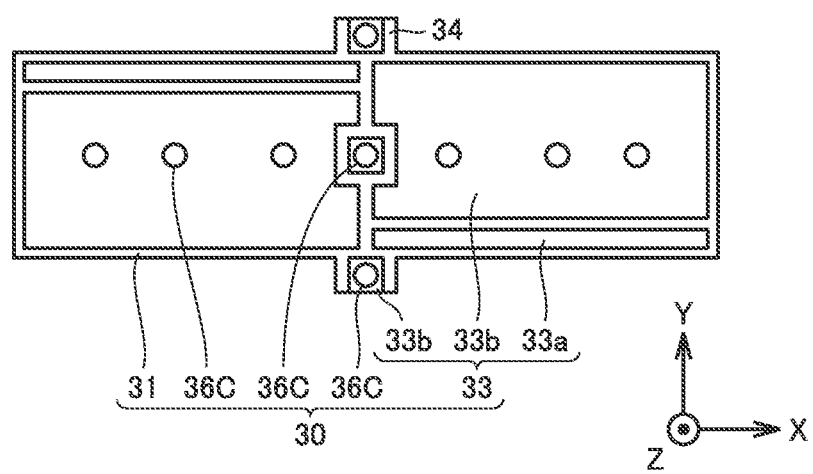
FIG. 27 is a schematic plan view specifically showing a manner of the core member and a conductor layer on the upper side in the Z direction of the printed circuit board in the power semiconductor device in FIG. 24.

First of all, a configuration of a power semiconductor device in the present embodiment is described with reference to FIG. 24 to FIG. 27. FIG. 24 is a schematic plan view showing a manner of the entire power semiconductor device in a two-dimensional view in a third embodiment. FIG. 25 is a schematic plan view specifically showing a portion having semiconductor elements in the power semiconductor device in FIG. 24. FIG. 26 is a schematic plan view specifically showing a manner of a core member and a conductor layer on the lower side in the Z direction of the printed circuit board in the power semiconductor device in FIG. 24. FIG. 27 is a schematic plan view specifically showing a manner of the core member and a conductor layer on the upper side in the Z direction of the printed circuit board in the power semiconductor device in FIG. 24. FIG. 24, FIG. 25, FIG. 26, and FIG. 27 correspond to FIG. 1, FIG. 3, FIG. 4, and FIG. 5 in the first example of the first embodiment.

Referring to FIG. 24 to FIG. 27, power semiconductor device 100 in the present embodiment basically has the same configuration as power semiconductor device 100 in the second embodiment. The same constituent element is denoted by the same reference sign and a description of particulars common to the second embodiment will not be repeated. Even when the signs are different, the description that is not repeated below is similar to that in the second embodiment.

In the present embodiment, printed circuit board 30 includes a pair of protrusion portions 34. Protrusion portion 34 is a portion at the middle portion with respect to the X direction of printed circuit board 30 and including first center line C1 and having an outer edge in a two-dimensional view protruding in the Y direction from a region other than the middle portion. That is, as shown in FIG. 24, FIG. 26, and FIG. 27, in protrusion portion 34, the outer edge on the negative side of the Y direction of the rectangular core member 31 protrudes to the negative side of the Y direction, that is, the lower side of FIG. 24. Furthermore, in protrusion portion 34, the outer edge on the positive side of the Y direction of the rectangular core member 31 protrudes to the positive side of the Y direction, that is, the upper side of FIG. 24.

As such, in the present embodiment, some of a plurality of metal column portions 51C excluding the middle portion in a two-dimensional view of printed circuit board 30 are arranged at a pair of protrusion portions 34. That is, two metal column portions 51C and two penetration portions 36C, excluding the middle of printed circuit board 30, for example, on first center line C1 in the second embodiment are respectively arranged to overlap a pair of protrusion portions 34. Thus, a pattern of first conductor layer 32 and a pattern of non-bonding pad 33b with a small planar area are formed on a surface of core member 31 at each of a pair of protrusion portions 34. Protrusion portions 34, the patterns with a small planar area overlapping them, and metal column portions 51C are arranged to be aligned with signal electrodes 21c that are exposed and do not overlap printed circuit board 30, substantially on a straight line with respect to the X direction.

First conductor layer 32, second conductor layer 33, and metal column portion 51C formed at protrusion portion 24 are formed to support printed circuit board 30. Thus, first conductor layer 32, second conductor layer 33, and metal column portion 51C formed at protrusion portion 24 are independent of a circuit (called power circuit) of the power conversion system described later.

An example having penetration portion 36C and metal column portion 51C has been described above. However, in FIG. 24 to FIG. 27, instead of penetration portion 36C and metal column portion 51C, penetration portion 36B and metal column portion 51B may be used, or missing portion 36A and metal column portion 51A may be used. Other modifications conceivable in the second embodiment are also basically conceivable in the third embodiment.

The operation effect of the present embodiment will now be described. The present embodiment achieves the following operation and effect in addition to the operation and effect of the first embodiment and the second embodiment.

It is preferable that power semiconductor device 100 according to the present disclosure is premised on the second embodiment. Furthermore, in this power semiconductor device 100, printed circuit board 30 includes a pair of protrusion portions 34 at the middle portion with respect to the X direction that is the first direction, including first center line C1 and having an outer edge in a two-dimensional view protruding in the Y direction that is the second direction from a region other than the middle portion in the X direction. Some of metal column portions 51A to 51C of the other metal column portions 51A to 51C excluding the one at the middle are arranged at a pair of protrusion portions 34. Such a configuration may be employed.

In this way, the area in which first conductor layer 32 and second conductor layer 33 functioning as a circuit (called power circuit) of the power conversion system described later can be expanded by the area of protrusion portions 34. Thus, the wiring density can be further increased.

Fourth Embodiment

Figure 28:
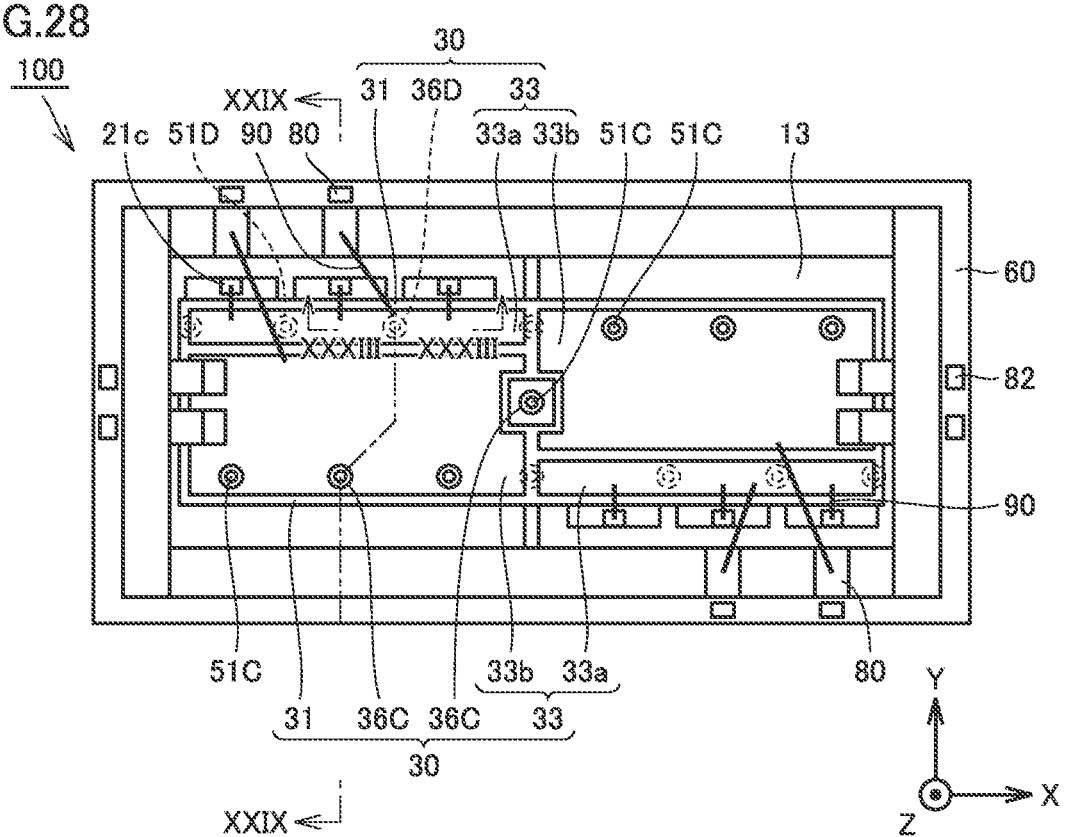
FIG. 28 is a schematic plan view showing a manner of the entire power semiconductor device in a two-dimensional view in a fourth embodiment.
Figure 29:
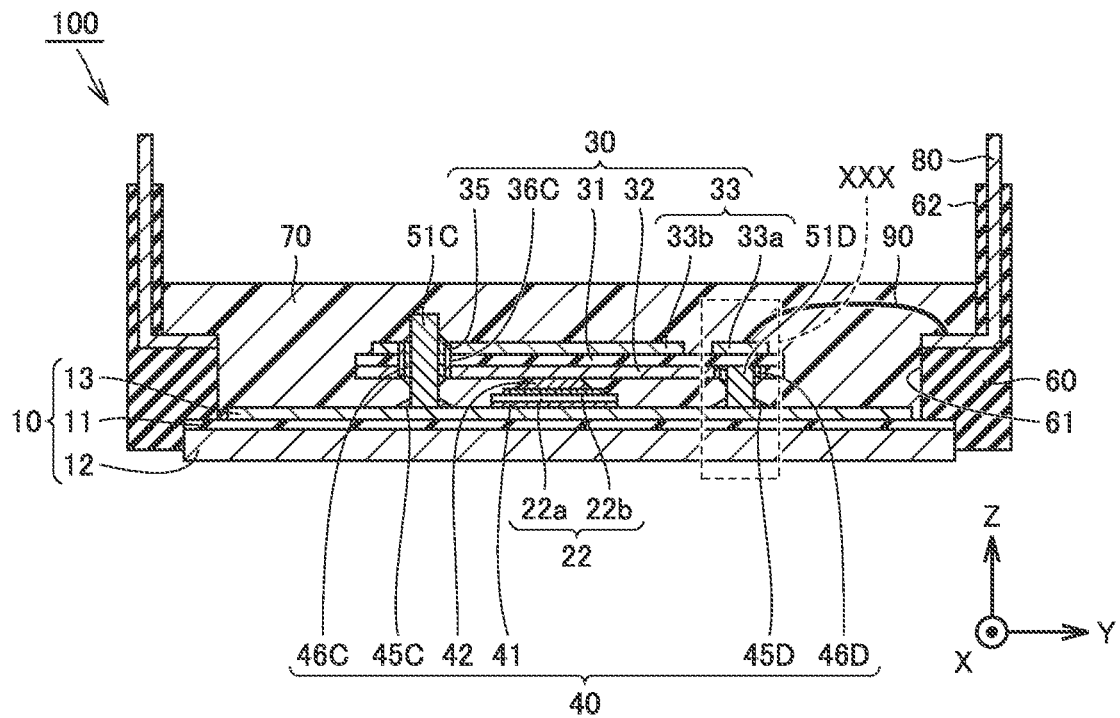
FIG. 29 is a schematic cross-sectional view of a portion along line XXIX-XXIX in FIG. 28 in the power semiconductor device in the fourth embodiment.
Figure 30:
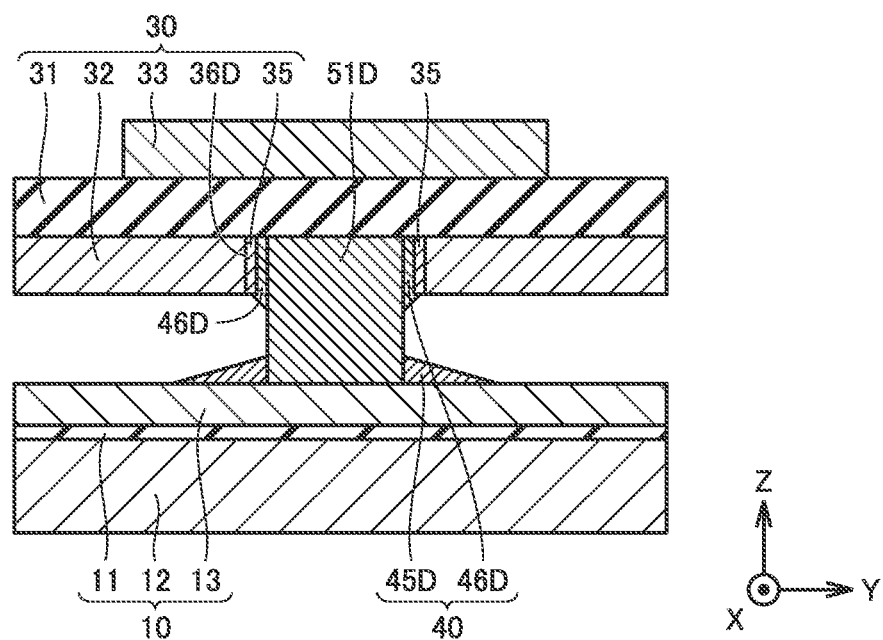
FIG. 30 is a schematic enlarged cross-sectional view of a portion XXX surrounded by a dotted line in FIG. 29 in the fourth embodiment.
Figure 31:
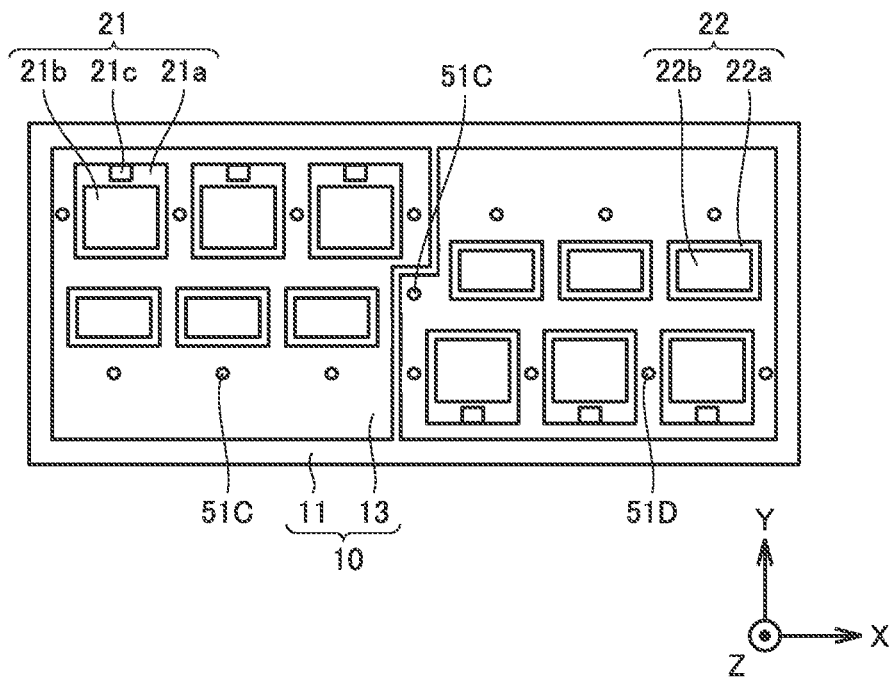
FIG. 31 is a schematic plan view specifically showing a portion having semiconductor elements in the power semiconductor device in FIG. 28.
Figure 32:
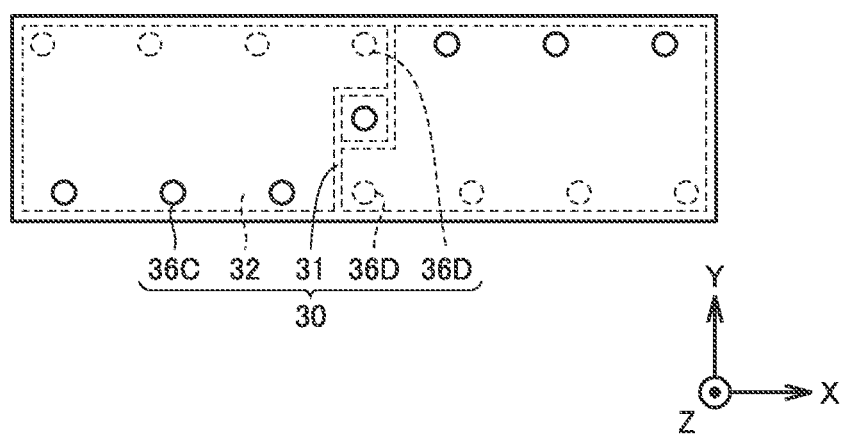
FIG. 32 is a schematic plan view specifically showing a manner of a core member and a conductor layer on the lower side in the Z direction of a printed circuit board in the power semiconductor device in FIG. 28.
Figure 33:
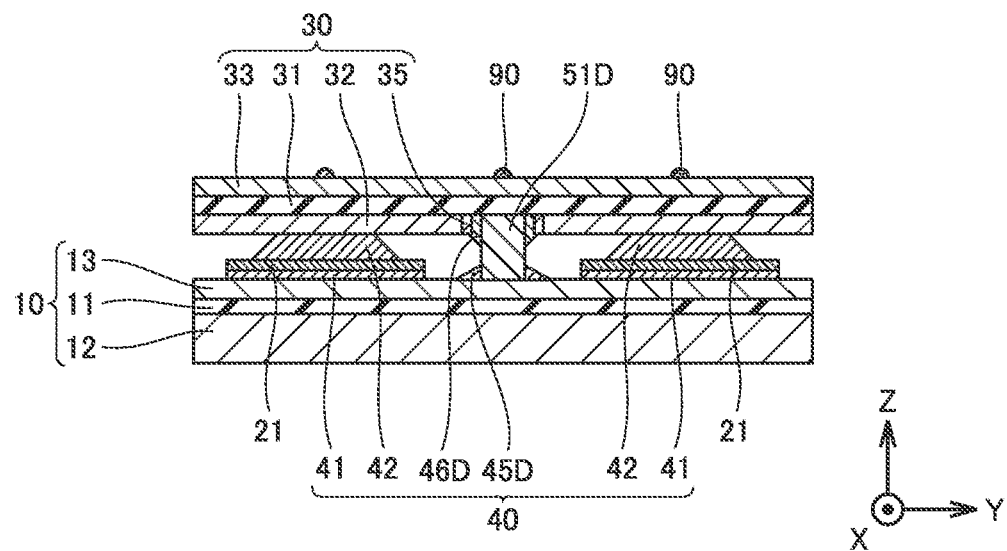
FIG. 33 is a schematic cross-sectional view of a portion along line XXXIII-XXXIII in FIG. 28 in the power semiconductor device in the fourth embodiment.

First of all, a configuration of a power semiconductor device in the present embodiment is described with reference to FIG. 28 to FIG. 33. FIG. 28 is a schematic plan view showing a manner of the entire power semiconductor device in a two-dimensional view in a fourth embodiment. FIG. 29 is a schematic cross-sectional view of a portion along line XXIX-XXIX in FIG. 28 in the power semiconductor device in the fourth embodiment. FIG. 30 is a schematic enlarged cross-sectional view of a portion XXX surrounded by a dotted line in FIG. 29 in the fourth embodiment. FIG. 31 is a schematic plan view specifically showing a portion having semiconductor elements in the power semiconductor device in FIG. 28. FIG. 32 is a schematic plan view specifically showing a manner of a core member and a conductor layer on the lower side in the Z direction of the printed circuit board in the power semiconductor device in FIG. 28. FIG. 33 is a schematic cross-sectional view of a portion along line XXXIII-XXXIII in FIG. 28 in the power semiconductor device in the fourth embodiment. FIG. 28, FIG. 29, FIG. 30, FIG. 31, and FIG. 32 correspond to FIG. 1, FIG. 2, FIG. 6, FIG. 3, and FIG. 4 in the first example of the first embodiment.

Referring to FIG. 28 to FIG. 33, power semiconductor device 100 in the present embodiment basically has the same configuration as power semiconductor device 100 in the first example of the first embodiment. The same constituent element is denoted by the same reference sign and a description of particulars common to the first example of the first embodiment will not be repeated. Even when the signs are different, the description that is not repeated below is similar to that in the first example of the first embodiment.

In the present embodiment, in addition to penetration portion 36C, a missing portion 36D is formed as a missing portion of printed circuit board 30. A plurality of missing portions 36D are formed at positions two-dimensionally overlapping bonding pad 33a. Similar to missing portion 36A, missing portion 36D does not penetrate through printed circuit board 30 and penetrates only a part of printed circuit board 30 in the Z direction that connects the first main surface and the second main surface. Specifically, missing portion 36D is formed so as to penetrate first conductor layer 32 in the region where it is formed such that the first main surface of core member 31 immediately below is exposed.

Metal column portion 51D passes through the inside of missing portion 36D so as to extend along the Z direction, in the same manner as metal column portion 51A. Metal column portion 51D does not penetrate through printed circuit board 30. Metal column portion 51D is connected to printed circuit board 30 through a first conductive member 46D in the inside of missing portion 36D. The lowermost portion of metal column portion 51D is connected to third conductor layer 13 of insulating substrate 10 by second conductive member 45D. The material of metal column portion 51D, first conductive member 46D, and second conductive member 45D is similar to that of metal column portion 51C, first conductive member 46C, and second conductive member 45C.

A plurality of, for example, eight missing portions 36D are formed in first conductor layer 32 of printed circuit board 30. Thus, power semiconductor device 100 has a plurality of, for example, eight metal column portions 51D. Eight missing portions 36D and eight metal column portions 51D passing therethrough are arranged at a distance from each other with respect to the X direction on a straight line extending in the X direction so as to be alternately aligned with emitter electrodes 21b that are the main electrodes of semiconductor elements 21. In other words, eight missing portions 36D and eight metal column portions 51D passing therethrough are arranged so as to sandwich semiconductor elements 21 (emitter electrodes 21b) in the X direction. As shown in FIG. 31, four on the upper side and four on the lower side in the Y direction, that is, a total of eight missing portions 36D and eight metal column portions 51D are arranged such that each of three semiconductor elements 21 in a row on each side is sandwiched in the X direction. The number of metal column portions 51D arranged linearly so as to sandwich semiconductor element 21 in the X direction is not limited. As a result, as shown in FIG. 33, metal column portions 51D and third conductive members 42 on main electrode 21b of semiconductor element 21 are arranged so as to be alternately aligned at a distance from each other with respect to the X direction.

Furthermore, as shown in FIG. 33, in the present embodiment, at least a part of a plurality of positions (a plurality of bonding portions) on bonding pad 33a where metal wire 90 is connected are arranged at positions two-dimensionally overlapping a plurality of metal column portions 51D. In other words, the bonding portion of metal wire 90 and metal column portion 51D are aligned in this order from the upper side to the lower side of FIG. 33 with respect to the Z direction. As used herein "a part" means both of a partial area of the entire one and some (at least one) of the plurality.

Signal electrode 21c and bonding pad 33a are connected by metal wire 90 in the same manner as in the first embodiment. At least a part of a plurality of bonding portions where metal wire 90 is bonded to bonding pad 33a are arranged at a position two-dimensionally overlapping third conductive member 42. In other words, the bonding portion of metal wire 90, third conductive member 42, and semiconductor element 21 are aligned in this order from the upper side to the lower side of FIG. 33 with respect to the Z direction. The definition of "a part" here is similar to that described above.

As a result, at least a part of each of a plurality of metal wires 90 two-dimensionally overlaps third conductive member 42 or metal column portion 51D. A plurality of metal wires 90 are wired such that they do not interfere with each other.

The operation effect of the present embodiment will now be described. The present embodiment achieves the following operation and effect in addition to the operation and effect of the first embodiment.

In power semiconductor device 100 according to the present disclosure, a plurality of missing portions 36D are formed at positions two-dimensionally overlapping bonding pad 33a. A plurality of missing portions 36D at positions two-dimensionally overlapping bonding pad 33a and metal column portions 51D in a plurality of missing portions 36D are arranged on a straight line so as to alternately aligned with emitter electrodes 21b that are the main electrodes of semiconductor elements 21. Thus, bonding pad 33a is supported by metal column portions 51D, for example, from below in the Z direction. Thus, warping of printed circuit board 30 due to load in the wire bonding process described above is further suppressed. Therefore, the bondability of metal wire 90 on bonding pad 33a is even more stable, and the reliability and the productivity are further improved.

In the power semiconductor device 100 above, at least a part of the position on bonding pad 33a where metal wire 90 is connected may be arranged at a position two-dimensionally overlapping metal column portion 51D at a position two-dimensionally overlapping bonding pad 33a. Thus, warping of printed circuit board 30 at a position (bonding portion) on bonding pad 33a where metal wire 90 is connected is further suppressed. Therefore, the bondability of metal wire 90 on bonding pad 33a is even more stable, and the reliability and the productivity are further improved.

Fifth Embodiment

In the present embodiment, the semiconductor device according to the foregoing first to fourth embodiments is applied to a power conversion device. Although the present disclosure is not limited to a specific kind of power conversion device, a case where the present invention is applied to a three-phase inverter will be described as a fifth embodiment.

Figure 34:
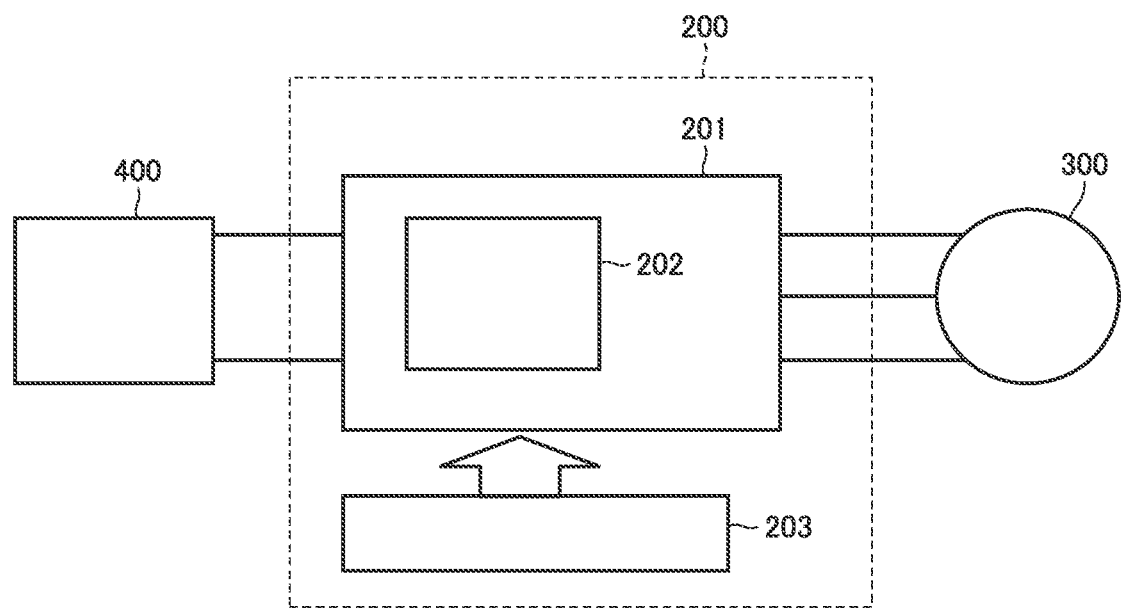
FIG. 34 is a block diagram showing a configuration of a power conversion system to which a power conversion device is applied according to a fifth embodiment.

FIG. 34 is a block diagram showing a configuration of a power conversion system to which a power conversion device according to the fifth embodiment is applied. The power conversion system shown in FIG. 34 includes a power supply 400, power conversion device 200, and a load 300. Power supply 400 is a direct-current power supply and supplies DC power to power conversion device 200. Power supply 400 can be configured with, for example, but not limited to, a DC system, a solar cell, or a storage battery or may be configured with a rectifying circuit or an AC/DC converter connected to an AC system. Power supply 400 may be configured with a DC/DC converter that converts DC power output from a DC system to intended power.

Power conversion device 200 is a three-phase inverter connected between power supply 400 and load 300 and converts DC power supplied from power supply 400 to AC power to supply AC power to load 300. As shown in FIG. 34, power conversion device 200 includes a main conversion circuit 201 to convert input DC power to AC power for output and a control circuit 203 to output a control signal for controlling main conversion circuit 201 to main conversion circuit 201.

Load 300 is a three-phase motor driven by AC power supplied from power conversion device 200. Load 300 is not limited to a certain application and is an electric motor installed in a variety of electric devices. Load 300 is used as a motor for, for example, hybrid cars, electric cars, rail vehicles, elevators, or air conditioners.

The detail of power conversion device 200 will be described below. A main conversion circuit 201 includes switching elements and freewheel diodes (neither shown). The switching element switches voltage supplied from power supply 400, whereby main conversion circuit 201 converts DC power supplied from power supply 400 to AC power and supplies the AC power to load 300. There are a variety of circuit configurations for main conversion circuit 201, but main conversion circuit 201 according to the present embodiment is a two-level three-phase full bridge circuit and may include six switching elements and six freewheeling diodes in anti-parallel with the respective switching elements. At least one of the switching element and the freewheeling diode of main conversion circuit 201 is semiconductor element 21 and diode 22 included in power semiconductor device 100 according to any one of the foregoing first to fourth embodiments. Power semiconductor device 100 according to any one of the foregoing first to fourth embodiments can be applied as power semiconductor module 202 included in main conversion circuit 201. Six switching elements are connected in series two by two to form upper and lower arms, and the upper and lower arms constitute a phase (U phase, V phase, W phase) of the full bridge circuit. The output terminals of the upper and lower arms, that is, three output terminals of main conversion circuit 201 are connected to load 300.

Main conversion circuit 201 also includes a drive circuit (not shown) that drives each switching element. The drive circuit may be contained in power semiconductor module 202 or the drive circuit may be provided separately from semiconductor module 202. The drive circuit generates a drive signal for driving a switching element included in main conversion circuit 201 and supplies the drive signal to the control electrode of the switching element of main conversion circuit 201. Specifically, in accordance with a control signal from control circuit 203 described later, a drive signal for turning on the switching element and a drive signal for turning off the switching element are output to the control electrode of each switching element. When the switching element is to be kept on, the drive signal is a voltage signal (ON signal) equal to or higher than a threshold voltage of the switching element. When the switching element is to be kept off, the drive signal is a voltage signal (OFF signal) equal to or lower than the threshold voltage of the switching element.

Control circuit 203 controls the switching elements of main conversion circuit 201 such that a desired power is supplied to load 300. Specifically, the time (ON time) during which each switching element of main conversion circuit 201 is in the ON state is calculated based on power to be supplied to load 300. For example, main conversion circuit 201 can be controlled by PWM control that modulates the ON time of the switching elements in accordance with a voltage to be output. Then, a control command (control signal) is output to the drive circuit of main conversion circuit 201 such that an ON signal is output to a switching element to be turned on and an OFF signal is output to a switching element to be turned off, at each point of time. The drive circuit outputs an ON signal or an OFF signal as a drive signal to the control electrode of each switching element in accordance with this control signal.

In power conversion device 200 according to the present embodiment, power semiconductor device 100 according to any one of the foregoing first to fourth embodiments is applied as power semiconductor module 202 included in main conversion circuit 201, as described above. Therefore, in power conversion device 200 according to the present embodiment, the size of insulating substrate 10 can be reduced and connection failure can be suppressed, in the same manner as the foregoing embodiments.

In the present embodiment, the present disclosure is applied to a two-level three-phase converter. However, the present disclosure is not limited thereto and can be applied to a variety of power conversion devices. In the present embodiment, a two-level power conversion device is employed. However, a three-level power conversion device may be employed. Alternatively, a multi-level power conversion device may be employed. When a power conversion device supplies power to a single-phase load, the present disclosure can be applied to a single-phase inverter. When a power conversion device supplies power to a DC load, for example, the present disclosure can be applied to a DC/DC converter or an AC/DC converter.

The power conversion device to which the present disclosure is applied is not limited to a case where the load is a motor and can be built in, for example, a power supply device for an electric discharge machine or a laser processing machine or a power supply device for an induction heating cooker or a contactless power supply system. The power conversion device to which the present disclosure is applied can be used as a power conditioner for a solar power generation system or a power storage system.

The features illustrated in the foregoing embodiments (and examples included therein) can be applied in combination as appropriate to an extent that is technically consistent.

Embodiments disclosed here should be understood as being illustrative rather than being limitative in all respects. The scope of the present disclosure is shown not in the foregoing description but in the claims, and it is intended that all modifications that come within the meaning and range of equivalence to the claims are embraced here.

REFERENCE SIGNS LIST 10 insulating substrate, 11 insulating layer, 12 fourth conductor layer, 13 third conductor layer, 20 semiconductor chip, 21 semiconductor element, 21a, 22a chip body, 21b emitter electrode, 21c gate electrode, 22b electrode, 30 printed circuit board, 31 core member, 32 first conductor layer, 33 second conductor layer, 33a bonding pad, 33b non-bonding pad, 34 protrusion portion, 35 conductor layer bonding portion, 36A, 36D missing portion, 36B, 36C penetration portion, 40 conductive member, 41 solder layer, 42 third conductive member, 42b bump-like solder, 42d, 45d paste solder, 45A, 45B, 45C, 45D second conductive member, 46A, 46B, 46C, 46D first conductive member, 46d solder, 51A, 51B, 51C, 51D metal column portion, 51B1 head portion, 51B2 columnar portion, 60 case, 61, 62 case inside surface, 70 sealing resin, 80 external electrode terminal, 82 external main electrode terminal, 90 metal wire, 100 power semiconductor device, 200 power conversion device, 201 main conversion circuit, 202 power semiconductor module, 203 control circuit, 300 load, 400 power supply, C1 first center line, C2 second center line.

The invention claimed is:

1. A power semiconductor device comprising:
an insulating substrate;
a semiconductor element bonded to one main surface of the insulating substrate; and
a printed circuit board bonded to face the semiconductor element, wherein
the semiconductor element has a main electrode and a signal electrode,
the printed circuit board includes a core member, a first conductor layer formed on a first main surface on the semiconductor element side of the core member, and a second conductor layer formed on a second main surface on an opposite side to the first main surface of the core member,
the second conductor layer has a bonding pad, and
the printed circuit board has a missing portion in which the first conductor layer is partially missing,
the power semiconductor device further comprising a metal column portion passing through inside of the missing portion, reaching the insulating substrate, and being connected to the printed circuit board by a first conductive member, wherein
the signal electrode and the bonding pad are connected by a metal wire, and
the metal column portion and the insulating substrate are bonded by a second conductive member.

2. The power semiconductor device according to claim 1, wherein
the missing portion is a penetration portion penetrating through the entire printed circuit board in a direction that connects the first main surface and the second main surface, and penetrating all of the first conductor layer, the core member, and the second conductor layer, and
the metal column portion extends from the one main surface of the insulating substrate, penetrates inside of the penetration portion, and extends to the penetration portion on an opposite side to the insulating substrate.

3. The power semiconductor device according to claim 1, wherein the main electrode and the printed circuit board are connected by a third conductive member.

4. The power semiconductor device according to claim 3, wherein at least a part of the main electrode of the semiconductor element to which the third conductive member adheres is arranged at a position two-dimensionally overlapping the bonding pad.

5. The power semiconductor device according to claim 4, wherein at least a part of a position on the bonding pad where the metal wire is connected is arranged at a position of the semiconductor element two-dimensionally overlapping the third conductive member.

6. The power semiconductor device according to claim 1, wherein
a plurality of the metal column portions are arranged,
one metal column portion among the metal column portions is arranged at middle of the printed circuit board in a two-dimensional view, and
other metal column portions excluding the one metal column portion among the metal column portions are arranged at positions point-symmetric to each other with respect to the middle of the printed circuit board.

7. The power semiconductor device according to claim 6, wherein
some metal column portions among the other metal column portions are arranged to be aligned on a first center line passing through middle with respect to a first direction in a two-dimensional view of the printed circuit board, and
the some metal column portions are arranged at positions line-symmetric to each other with respect to a second center line passing through middle with respect to a second direction orthogonal to the first direction in a two-dimensional view of the printed circuit board.

8. The power semiconductor device according to claim 7, wherein
the printed circuit board includes a pair of protrusion portions at a middle portion with respect to the first direction, each protrusion portion including the first center line and having an outer edge in a two-dimensional view protruding in the second direction from a region other than the middle portion, and
each of the some metal column portions are arranged at a corresponding one of the pair of protrusion portions.

9. The power semiconductor device according to claim 1, wherein
  a plurality of the missing portions are formed at positions two-dimensionally overlapping the bonding pad, and
  the missing portions at positions two-dimensionally overlapping the bonding pad and the metal column portions in the missing portions are arranged to be alternately aligned with the main electrode on a straight line.

10. The power semiconductor device according to claim 9, wherein at least a part of a position on the bonding pad where the metal wire is connected is arranged at a position two-dimensionally overlapping the metal column portion at a position two-dimensionally overlapping the bonding pad.

11. A power conversion device comprising:
  a main conversion circuit including the power semiconductor device according to claim 1, the main conversion circuit converting input power and outputting the converted power; and
  a control circuit to output a control signal for controlling the main conversion circuit to the main conversion circuit.

12. A method of manufacturing a power semiconductor device, the method comprising the steps of:
  preparing an insulating substrate having one main surface on which a semiconductor element having a signal electrode is bonded;
  preparing a printed circuit board including a core member, a first conductor layer formed on a first main surface of the core member, and a second conductor layer formed on a second main surface on an opposite side to the first main surface of the core member, the printed circuit board having a missing portion in which the first conductor layer is partially missing;
  bonding a metal column portion to the missing portion by a first conductive member, the metal column portion passing through inside of the missing portion and extending to outside of the missing portion;
  arranging the printed circuit board such that the printed circuit board faces the semiconductor element, and bonding the metal column portion and the insulating substrate by a second conductive member; and
  connecting the signal electrode to a bonding pad included in the second conductor layer by a metal wire.

13. The method of manufacturing a power semiconductor device according to claim 12, wherein
  the missing portion is a penetration portion penetrating through the entire printed circuit board in a direction that connects the first main surface and the second main surface, and penetrating all of the first conductor layer, the core member, and the second conductor layer, and
  in the step of bonding by the second conductive member, the metal column portion is arranged to extend from the one main surface of the insulating substrate, penetrate inside of the penetration portion, and extend to the penetration portion on an opposite side to the insulating substrate.

* * * * *